US008134685B2

(12) United States Patent
Nishii et al.

(10) Patent No.: US 8,134,685 B2
(45) Date of Patent: Mar. 13, 2012

(54) LIQUID RECOVERY SYSTEM, IMMERSION EXPOSURE APPARATUS, IMMERSION EXPOSING METHOD, AND DEVICE FABRICATING METHOD

(75) Inventors: Yasufumi Nishii, Kumagaya (JP); Hiroyuki Nagasaka, Kumagaya (JP); Takeshi Okuyama, Yokohama (JP)

(73) Assignee: Nikon Corporation, Tokyo (JP)

( * ) Notice: Subject to any disclaimer, the term of this patent is extended or adjusted under 35 U.S.C. 154(b) by 602 days.

(21) Appl. No.: 12/076,331

(22) Filed: Mar. 17, 2008

(65) Prior Publication Data

US 2008/0233512 A1    Sep. 25, 2008

Related U.S. Application Data

(60) Provisional application No. 60/907,186, filed on Mar. 23, 2007.

(51) Int. Cl.
*G03B 27/42* (2006.01)
*G03B 27/52* (2006.01)

(52) U.S. Cl. .......................................... 355/53; 355/30
(58) Field of Classification Search .................. 355/30, 355/53, 72, 77; 250/548
See application file for complete search history.

(56) References Cited

U.S. PATENT DOCUMENTS

| | | | |
|---|---|---|---|
| 5,969,441 A | 10/1999 | Loopstra et al. | |
| 6,208,407 B1 | 3/2001 | Loopstra | |
| 6,262,796 B1 | 7/2001 | Loopstra et al. | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,590,698 B1 | 7/2003 | Ohtsuki et al. | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 7,023,610 B2 | 4/2006 | Ohtsuki et al. | |
| 7,804,577 B2 * | 9/2010 | Leenders et al. ................. 355/53 |
| 8,004,651 B2 | 8/2011 | Nagasaka | |
| 2006/0023182 A1 | 2/2006 | Novak et al. | |
| 2006/0038968 A1 | 2/2006 | Kemper et al. | |
| 2006/0152697 A1 | 7/2006 | Poon et al. | |
| 2006/0250593 A1 | 11/2006 | Nishii | |
| 2007/0109512 A1 | 5/2007 | Kate et al. | |
| 2007/0110213 A1 | 5/2007 | Leenders et al. | |

(Continued)

FOREIGN PATENT DOCUMENTS

EP    1 063 742 A1    12/2000

(Continued)

OTHER PUBLICATIONS

International Search Report issued in Application No. PCT/JP2008/055625 on Jun. 6, 2008.

(Continued)

*Primary Examiner* — Hung Henry Nguyen
(74) *Attorney, Agent, or Firm* — Oliff & Berridge, PLC

(57) ABSTRACT

A liquid recovery system is used by an immersion exposure apparatus. The liquid recovery system comprises: a plate that has a first surface and a second surface on the side opposite the first surface; and a liquid recovery part, at least part of which opposes the second surface with a first gap interposed therebetween. The liquid recovery system recovers the liquid on a movable object that opposes the first surface of the plate via the liquid recovery part.

67 Claims, 10 Drawing Sheets

U.S. PATENT DOCUMENTS

| | | |
|---|---|---|
| 2007/0132976 A1* | 6/2007 | Nagasaka ................. 355/57 |
| 2007/0216889 A1 | 9/2007 | Nishii |
| 2007/0222959 A1 | 9/2007 | Nagasaka et al. |

FOREIGN PATENT DOCUMENTS

| | | |
|---|---|---|
| EP | 1 420 299 A2 | 5/2004 |
| EP | 1 628 163 A2 | 2/2006 |
| EP | 1 768 169 A1 | 3/2007 |
| EP | 1 865 542 A1 | 12/2007 |
| EP | 1 903 398 A1 | 3/2008 |
| JP | A-10-163099 | 6/1998 |
| JP | A-10-214783 | 8/1998 |
| JP | A-11-135400 | 5/1999 |
| JP | T-2000-505958 | 5/2000 |
| JP | A-2000-164504 | 6/2000 |
| JP | T-2004-519850 | 7/2004 |
| WO | WO 99/46835 A1 | 9/1999 |
| WO | WO 99/49504 A1 | 9/1999 |
| WO | WO 01/35168 A1 | 5/2001 |
| WO | WO 2004/019128 A2 | 3/2004 |
| WO | WO 2005/024517 A2 | 3/2005 |
| WO | WO 2005/059617 A2 | 6/2005 |
| WO | WO 2005/059618 A2 | 6/2005 |
| WO | WO 2005/119742 A1 | 12/2005 |
| WO | WO 2006/106851 A1 | 10/2006 |

OTHER PUBLICATIONS

Written Opinion in Application No. PCT/JP2008/055625 on Jun. 6, 2008.

* cited by examiner

FIG. 3
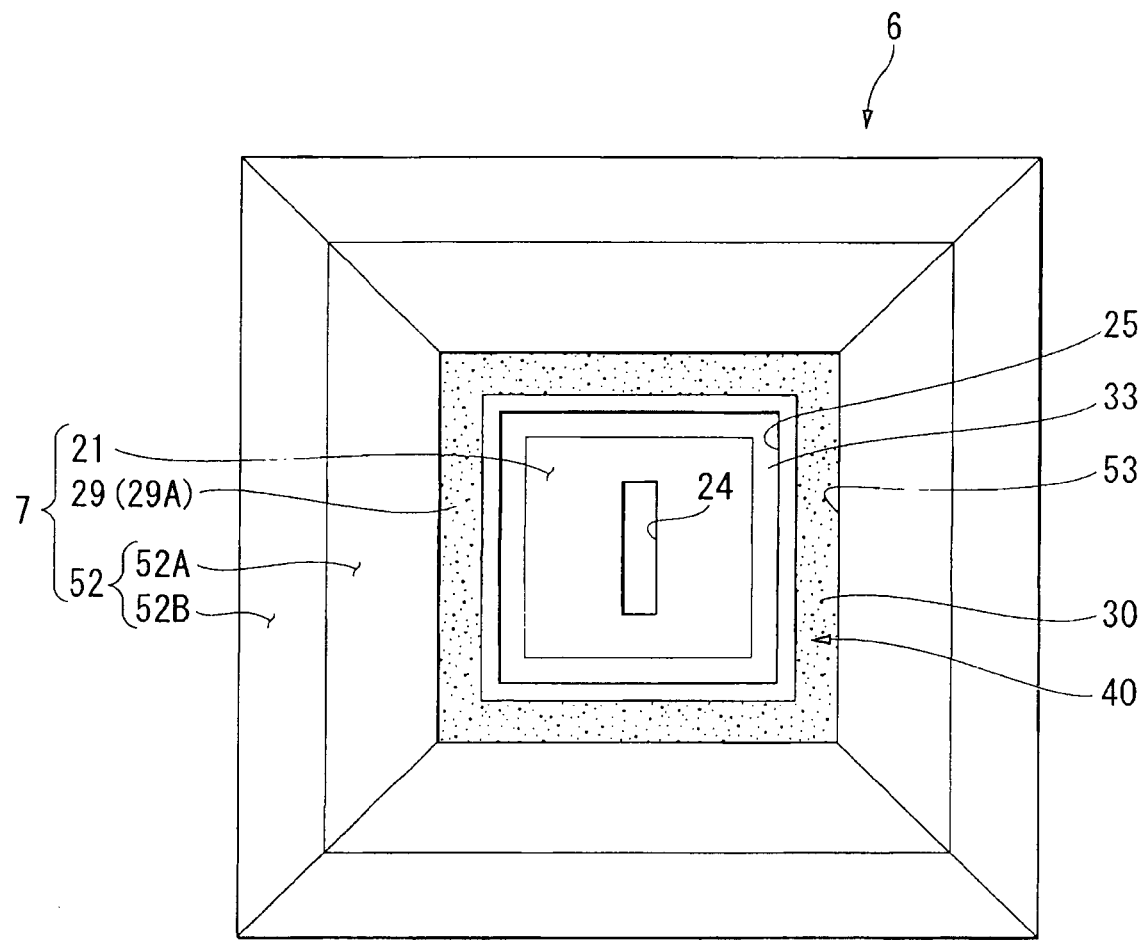
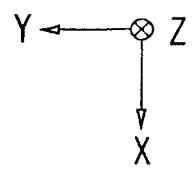

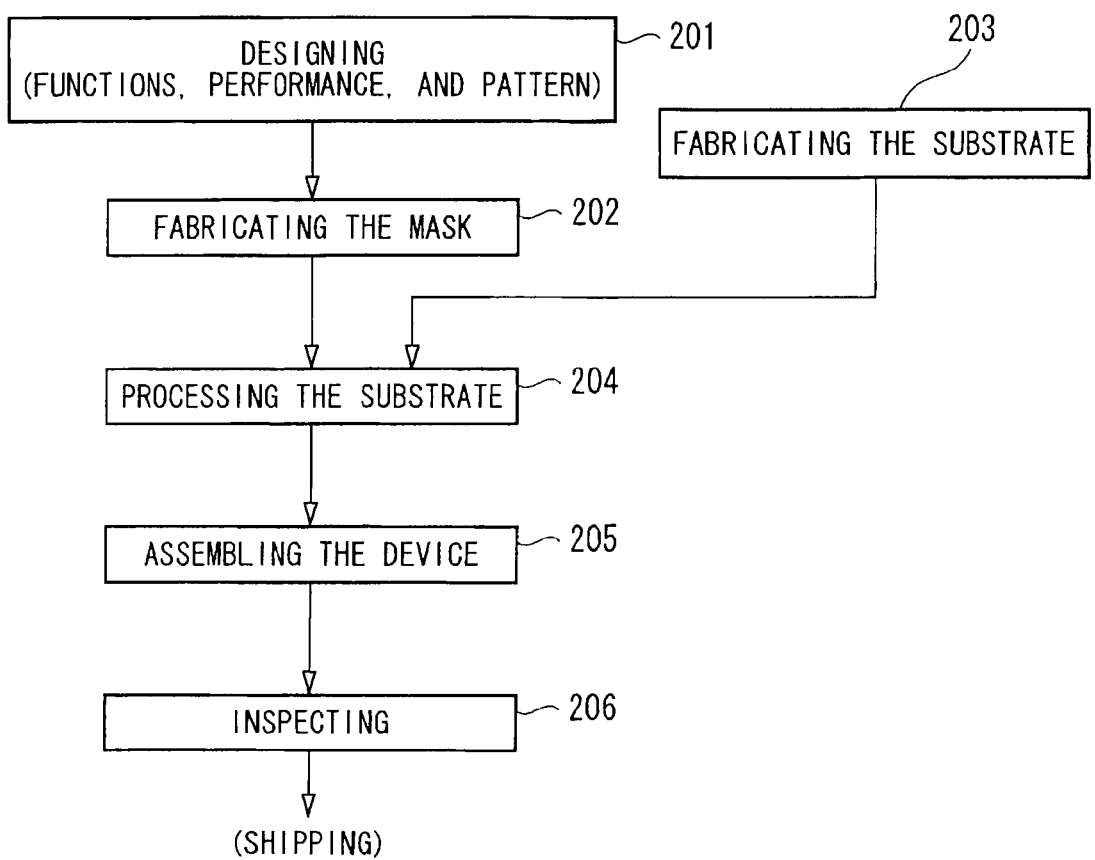

LIQUID RECOVERY SYSTEM, IMMERSION EXPOSURE APPARATUS, IMMERSION EXPOSING METHOD, AND DEVICE FABRICATING METHOD

CROSS-REFERENCE TO RELATED APPLICATION

This application is non-provisional application claiming benefit of provisional application No. 60/907,186, filed Mar. 23, 2007, the contents of which are incorporated herein by reference.

BACKGROUND

1. Field of the Invention

The present invention relates to a liquid recovery system, an immersion exposure apparatus that uses such, an immersion exposing method, and a device fabricating method.

2. Description of Related Art

Among exposure apparatuses used in a photolithographic process, an immersion exposure apparatus is known that exposes a substrate through a liquid, as disclosed in PCT International Publication No. WO99/49504.

With exposure apparatuses, there is a demand to increase the travel speed of substrates in order to increase device productivity and the like. In an immersion exposure apparatus, liquid is recovered. Nevertheless, there is a possibility that the liquid will not be adequately recovered and that it will leak or remain on the substrate. Therefore, there is a possibility that exposure failures will occur such as the generation of defects in the pattern that is formed on the substrate. As a result, there is a possibility that defective devices will be fabricated.

A purpose of some aspects in the present invention is to provide a liquid recovery system that can recover a liquid satisfactorily. Yet another purpose is to provide an immersion exposure apparatus and an immersion exposing method that can prevent exposure failures. Yet another purpose is to provide a device fabricating method that can prevent the production of defective devices.

SUMMARY

A first aspect of the invention provides a liquid recovery system that is used by an immersion exposure apparatus and comprises: a plate that comprises a first surface and a second surface on the side opposite the first surface; and a liquid recovery part, at least a part of which opposes the second surface with a first gap interposed therebetween; wherein, liquid on a movable object that opposes the first surface of the plate is recovered via the liquid recovery part.

A second aspect of the invention provides an immersion exposure apparatus that exposes a substrate and comprises: an optical member that comprises an emergent surface from which exposure light is emitted; a plate that comprises a first surface and a second surface on the side opposite the first surface; and a liquid recovery part, at least a part of which opposes the second surface with a first gap interposed therebetween; wherein, liquid on an object that opposes the first surface of the plate is recovered via the liquid recovery part.

A third aspect of the invention provides a device fabricating method that comprises: exposing a substrate using an immersion exposure apparatus according to the above aspect; and developing the exposed substrate.

A fourth aspect of the invention provides an immersion exposing method that exposes a substrate and comprises: exposing the substrate with exposure light through a liquid on the substrate; and recovering the liquid on the substrate using a liquid recovery system during the exposure of the substrate; wherein, the liquid recovery system comprises; a plate that comprises a first surface and a second surface on the side opposite the first surface; and a liquid recovery part that is disposed so that at least a part of it opposes the second surface with a first gap interposed therebetween; wherein, the liquid on the substrate that opposes the first surface of the plate is recovered via the liquid recovery part.

A fifth aspect of the invention provides a device fabricating method that comprises the steps of: exposing a substrate using an exposing method according to the above aspect; and developing the exposed substrate.

A sixth aspect of the invention provides an immersion exposure apparatus comprising: an optical member comprising an exit surface from which light exits, the exit surface being in contact with a liquid, the liquid being disposed in at least a space between the exit surface and a movable object; a liquid contact surface facing the movable object; a liquid recovery surface surrounding the liquid contact surface and comprising a suction region via which the liquid is suctioned; a first surface facing the movable object, at least a part of the first surface being disposed between the liquid recovery surface and the movable object; a second surface being disposed between the liquid recovery surface and the first surface, at least a part of the liquid second surface facing the liquid recovery surface; and a gap into which the liquid flows via an opening between the liquid recovery surface and the second surface, wherein the liquid, which has been flowed into the gap, is recovered via the liquid recovery surface.

A seventh aspect of the invention provides an immersion exposure apparatus comprising: an optical member comprising an exit surface from which light exits, the exit surface being in contact with a liquid, the liquid being disposed in at least a space between the exit surface and a movable object; a liquid contact surface facing the movable object; a liquid recovery surface surrounding the liquid contact surface and comprising a suction region via which the liquid is suctioned, a part of the suction region being adjacent to an optical path of the light and facing the movable object; a first surface facing the movable object, at least a part of the first surface being disposed between the liquid recovery surface and the movable object; and a second surface facing the liquid recovery surface, at least a part of the second surface being disposed between the first surface and the liquid recovery surface.

An eighth aspect of the invention provides an immersion exposure apparatus comprising: an optical member comprising an exit surface from which light exits, the exit surface being in contact with a liquid, the liquid being disposed in at least a space between the exit surface and a movable object; a liquid contact surface facing the movable object; a liquid recovery surface surrounding the liquid contact surface and comprising a suction region via which the liquid is suctioned; and a first surface facing the movable object, the first surface covering a part of the suction region that is relatively far from the liquid contact surface, the first surface uncovering a part of the suction region that is relatively closer to the liquid contact surface.

A ninth aspect of the invention provides an immersion exposure apparatus comprising: an optical member comprising an exit surface from which light exits, the exit surface being in contact with a liquid, the liquid being disposed in at least a space between the exit surface and a movable object; a liquid contact surface facing the movable object; a liquid recovery surface surrounding the liquid contact surface and comprising a suction region via which the liquid is suctioned;

a first surface facing the movable object, at least a part of the first surface being disposed between the liquid recovery surface and the movable object; a second surface being disposed between the liquid recovery surface and the first surface, at least a part of the liquid second surface facing the liquid recovery surface; and a gap into which the liquid flows via an opening between the liquid recovery surface and the second surface, wherein a position of the second surface at the opening is closer to the movable object than the liquid contact surface.

A tenth aspect of the invention provides an immersion exposure apparatus comprising: an optical member comprising an exit surface from which light exits, the exit surface being in contact with a liquid, the liquid being disposed in at least a space between the exit surface and a movable object; a liquid contact surface facing the movable object; a liquid recovery surface surrounding the liquid contact surface and comprising a suction region via which the liquid is suctioned; a gap into which the liquid flows via an opening between the liquid contact surface and the recovery surface; and a first surface facing the movable object, at least a part of the first surface being disposed between the liquid recovery surface and the movable object.

An eleventh aspect of the invention provides an immersion exposure apparatus comprising: an optical member comprising an exit surface from which light exits, the exit surface being in contact with a liquid, the liquid being disposed in at least a space between the exit surface and a movable object; a liquid contact surface facing the movable object; a liquid recovery surface surrounding the liquid contact surface and comprising a suction region via which the liquid is suctioned; a first gap into which the liquid flows via an opening between the liquid contact surface and the recovery surface; a first surface facing the movable object, at least a part of the first surface being disposed between the liquid recovery surface and the movable object; a second surface being disposed between the liquid recovery surface and the first surface, at least a part of the liquid second surface facing the liquid recovery surface; and a second gap into which the liquid flows via an opening between the liquid recovery surface and the second surface.

BRIEF DESCRIPTION OF THE DRAWINGS

FIG. 3 shows the immersion member according to the first embodiment, viewed from below.

FIG. 10 is a flow chart diagram that shows one example of a process of fabricating a microdevice.

DESCRIPTION OF EMBODIMENTS

The following explains the embodiments of the present invention referencing the drawings, but the present invention is not limited thereto. Furthermore, the following explanation defines an XYZ orthogonal coordinate system, and the positional relationships among members are explained referencing this system. Furthermore, prescribed directions within the horizontal plane are the X axial directions, the directions that are orthogonal to the X axial directions in the horizontal plane are the Y axial directions, and the directions that are orthogonal to the X axial directions and the Y axial directions (i.e., the vertical directions) are the Z axial directions. In addition, the rotational (the inclined) directions around the X, Y, and Z axes are the θX, θY, and θZ directions, respectively.

First Embodiment

Figure 1:
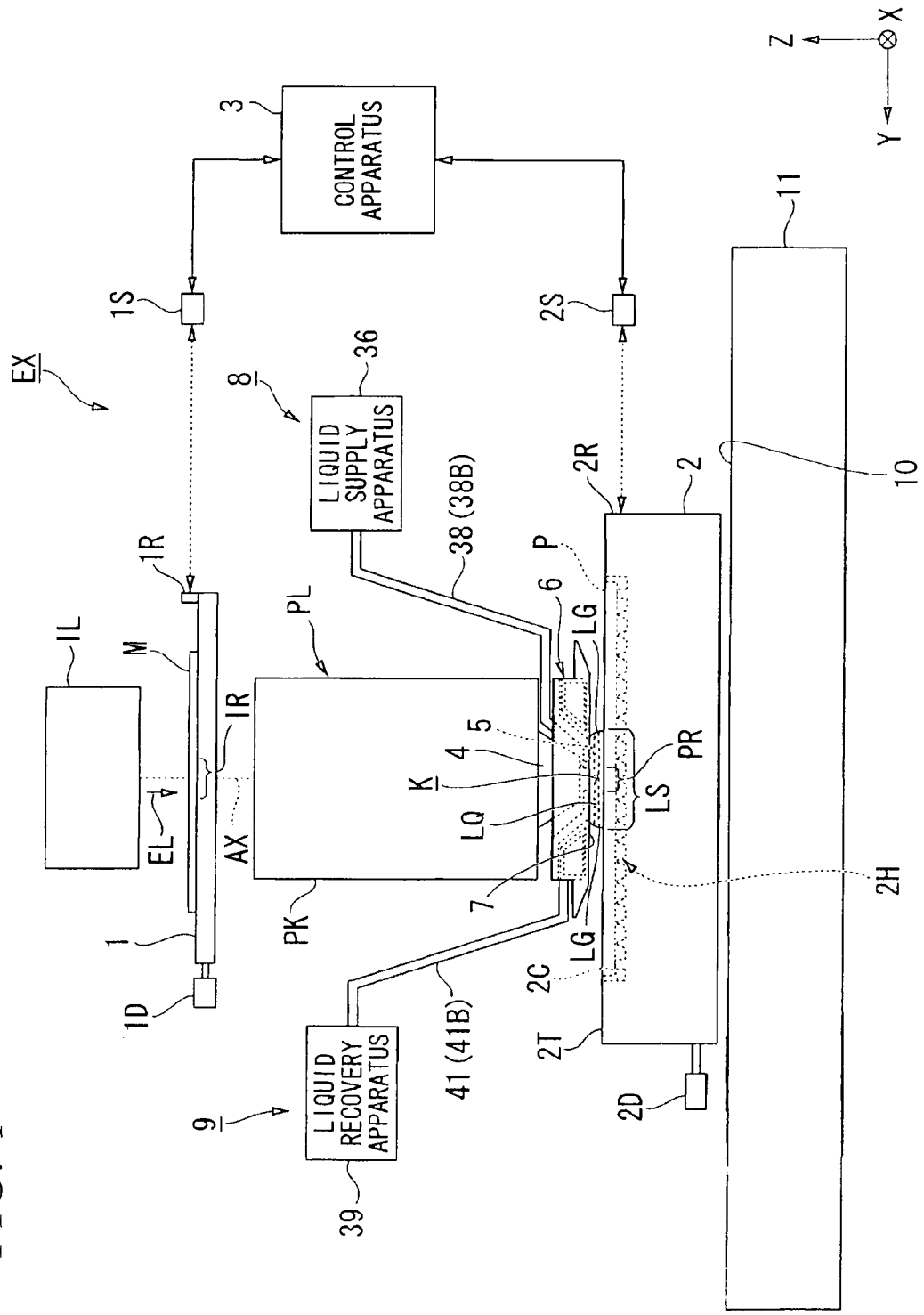
FIG. 1 is a schematic block diagram that shows an exposure apparatus according to a first embodiment.

A first embodiment will now be explained. FIG. 1 is a schematic block diagram that shows an exposure apparatus EX according to the first embodiment. In FIG. 1, the exposure apparatus EX comprises a mask stage 1, which is capable of moving while holding a mask M, a substrate stage 2, which is capable of moving while holding a substrate P, an illumination system IL, which illuminates the mask M with exposure light EL, a projection optical system PL, which projects an image of a pattern of the mask M that is illuminated by the exposure light EL onto the substrate P, and a control apparatus 3 that controls the operation of the entire exposure apparatus EX.

Furthermore, the substrate P referenced herein is a substrate for fabricating a device and can include one that has a base material, such as a semiconductor wafer such as a silicon wafer, whereon a film of, for example, a photosensitive material (photoresist) is formed, or include one on which various types of membrane such as a protective membrane (top coat membrane) other than a photosensitive membrane is coated. The mask M includes a reticle wherein a device pattern is formed that is projected onto the substrate P. In addition, a transmitting type mask is used as the mask M in the present embodiment, but a reflection type mask can also be used. The transmission-type mask is not limited to a binary mask on which a pattern is formed with a shading film, and also includes, for example, a phase-shift mask such as a half-tone type or a spatial frequency modulation type.

The exposure apparatus EX of the present embodiment is an immersion exposure apparatus that exposes the substrate P with the exposure light EL through a liquid LQ and forms an immersion space LS so that at least part of an optical path space K of the exposure light EL is filled with the liquid LQ. Furthermore, the optical path space K of the exposure light EL is a space that includes the optical path through which the exposure light EL passes. The immersion space LS is a space that is filled with the liquid LQ. In the present embodiment, water (pure water) is used as the liquid LQ.

In the present embodiment, the immersion space LS is formed so that the optical path space K on the image plane side of a last optical element 4, which is the optical element of a plurality of optical elements of the projection optical system PL that is closest to the image plane of the projection optical system PL, is filled with the liquid LQ. The last optical element 4 comprises an emergent surface 5 that emits the exposure light EL toward the image plane of the projection optical system PL. The immersion space LS is formed so that the optical path space K on the emergent side (the image plane side) of the last optical element 4 is filled with the liquid LQ.

The exposure apparatus EX comprises a liquid immersion member 6 that is capable of forming the immersion space LS. The liquid immersion member 6 is disposed in the vicinity of the last optical element 4.

The liquid immersion member 6 comprises a lower surface 7. An object that is movable on the emergent side (the image plane side) of the last optical element 4 is capable of moving to a position that opposes the emergent surface 5 of the last optical element 4, and is also capable of moving to a position that opposes the lower surface 7 of the liquid immersion member 6. When the object is disposed at a position that opposes the emergent surface 5 of the last optical element 4, at least part of the lower surface 7 of the liquid immersion member 6 and the front surface of the object are opposed. When the lower surface 7 of the liquid immersion member 6 and the front surface of the object are opposed, the exposure apparatus EX can hold the liquid LQ therebetween. In addition, when the emergent surface 5 of the last optical element 4 and the front surface of the object are opposed, the exposure apparatus EX can hold the liquid LQ therebetween. Holding the liquid LQ between the lower surface 7 of the liquid immersion member 6 and the emergent surface 5 of the last optical element 4 on one side and the front surface of the object on the other side makes it possible for the exposure apparatus EX to form the immersion space LS so that the optical path space K between the emergent surface 5 of the last optical element 4 and the front surface of the object is filled with the liquid LQ.

In addition, the exposure apparatus EX comprises a supply mechanism 8 that supplies the liquid LQ and a recovery mechanism 9 that recovers the liquid LQ. The supply mechanism 8 is capable of supplying the liquid LQ to the space between the front surface of the object and the lower surface 7 of the liquid immersion member 6 as well as to the space between the front surface of the object and the emergent surface 5 of the last optical element 4. The recovery mechanism 9 is capable of recovering the liquid LQ from the space between the front surface of the object and the lower surface 7 of the liquid immersion member 6 as well as the space between the front surface of the object and the emergent surface 5 of the last optical element 4.

In the present embodiment, the object that is capable of opposing the lower surface 7 of the liquid immersion member 6 and the emergent surface 5 of the last optical element 4 includes at least one of the substrate stage 2 and the substrate P that is held thereby. Furthermore, to simplify the explanation, the following principally explains the state wherein the substrate P opposes the lower surface 7 of the liquid immersion member 6 as well as the emergent surface 5 of the last optical element 4.

In the present embodiment, the immersion space LS is formed so that part of the area (a local area) of the front surface of the object that is disposed at a position that opposes the lower surface 7 of the liquid immersion member 6 as well as the emergent surface 5 of the last optical element 4 is covered by the liquid LQ, and an interface (meniscus, edge) LG of the liquid LQ is formed between the front surface of the object and the lower surface 7 of the liquid immersion member 6. Namely, the exposure apparatus EX of the present embodiment adopts a local liquid immersion system wherein the immersion space LS is formed so that part of the area on the substrate P that includes a projection region PR of the projection optical system PL is covered with the liquid LQ during the exposure of the substrate P. The state of the interface LG is not limited to the aspect shown in the figures.

The illumination system IL illuminates a prescribed illumination region IR on the mask M with the exposure light EL, which has uniform luminous flux intensity distribution. Examples of light that can be used as the exposure light EL emitted from the illumination system IL include: deep ultraviolet (DUV) light such as bright line (g-line, h-line, or i-line) light emitted from, for example, a mercury lamp, and KrF excimer laser light (248 nm wavelength); and vacuum ultraviolet (VUV) light such as ArF excimer laser light (193 nm wavelength) and $F_2$ laser light (157 nm wavelength). In the present embodiment, ArF excimer laser light, which is ultraviolet light (vacuum ultraviolet light), is used as the exposure light EL.

The mask stage 1, in the state wherein it holds the mask M, is movable in the X axial, Y axial, and θZ directions by a drive system 1D that comprises an actuator, e.g., a linear motor. A laser interferometer 1S measures positional information of the mask stage 1 (the mask M) in the X axial, Y axial, and θZ directions. The laser interferometer 1S measures the positional information using a reflecting mirror 1R, which is provided to the mask stage 1. Based on the measurement result of the laser interferometer 1S, the control apparatus 3 controls the position of the mask M, which is held by the mask stage 1, by driving the drive system 1D.

The projection optical system PL projects an image of the pattern of the mask M to the substrate P at a prescribed projection magnification. A lens barrel PK holds the plurality of optical elements of the projection optical system PL. The projection optical system PL of the present embodiment is a reduction system that has a projection magnification of, for example, ¼, ⅕, or ⅛. Furthermore, the projection optical system PL may be a reduction system, a unity magnification system or an enlargement system. In the present embodiment, an optical axis AX of the projection optical system PL is parallel to the Z axial directions. In addition, the projection optical system PL may be: a dioptric system that does not include catoptric elements; a catoptric system that does not include dioptric elements; or a catadioptric system that includes both catoptric elements and dioptric elements. In addition, the projection optical system PL may form either an inverted image or an erect image.

The substrate stage 2, in the state wherein it holds the substrate P, can be moved with six degrees of freedom, i.e., in the X axial, Y axial, Z axial, θX, θY, and θZ directions, by a drive system 2D that comprises an actuator, e.g., a linear motor. A laser interferometer 2S measures positional information of the substrate stage 2 (the substrate P) in the X axial, the Y axial, and the θZ directions. The laser interferometer 2S measures the positional information using a reflecting mirror 2R, which is provided to the substrate stage 2. In addition, a focus and level detection system (not shown) detects the surface position information (positional information in the Z axial, θX, and θY directions) of the front surface of the substrate P, which is held by the substrate stage 2. Based on the measurement results of the laser interferometer 2S and the detection results of the focus and level detection system, the control apparatus 3 controls the position of the substrate P, which is held by the substrate stage 2, by driving the drive system 2D.

The substrate stage 2 comprises a substrate holder 2H, which holds the substrate P, and an upper surface 2T, which is disposed around the substrate holder 2H and is capable of opposing the emergent surface 5 of the last optical element 4.

The substrate holder 2H is disposed in a recessed part 2C, which is provided in the substrate stage 2. The substrate holder 2H holds the substrate P so that its front surface and the XY plane are substantially parallel. The front surface of the substrate P held by the substrate holder 2H is capable of opposing the emergent surface 5 of the last optical element 4. In addition, the upper surface 2T of the substrate stage 2 is a flat surface that is substantially parallel to the XY plane. The front surface of the substrate P held by the substrate holder 2H and the upper surface 2T of the substrate stage 2 are disposed in substantially the same plane and are substantially flush with one another. The upper surface 2T is formed from a material that includes, for example, fluorine, and is therefore liquid repellent with respect to the liquid LQ. The contact angle between the upper surface 2T and the liquid LQ is, for example, 80° or greater.

The exposure apparatus EX comprises a base plate 11, which comprises a guide surface 10 that movably supports the substrate stage 2. In the present embodiment, the guide surface 10 is substantially parallel to the XY plane. The substrate stage 2 is capable of moving along the guide surface 10 in the X and Y directions (the two dimensional directions).

The exposure apparatus EX of the present embodiment is a scanning type exposure apparatus (a so-called scanning stepper) that projects the image of the pattern of the mask M onto the substrate P while synchronously moving the mask M and the substrate P in prescribed scanning directions. In the present embodiment, the scanning directions (the synchronous movement directions) of the substrate P and of the mask M are the Y axial directions. The exposure apparatus EX moves the substrate P in one of the Y axial directions with respect to the projection region PR of the projection optical system PL, and radiates the exposure light EL onto the substrate P through the projection optical system PL and the liquid LQ in the immersion space LS on the substrate P while moving the mask M in the other of the Y axial directions with respect to the illumination region IR of the illumination system IL synchronized to the movement of the substrate P. Thus, the image of the pattern of the mask M is projected onto the substrate P, which is thereby exposed with the exposure light EL.

Figure 2:
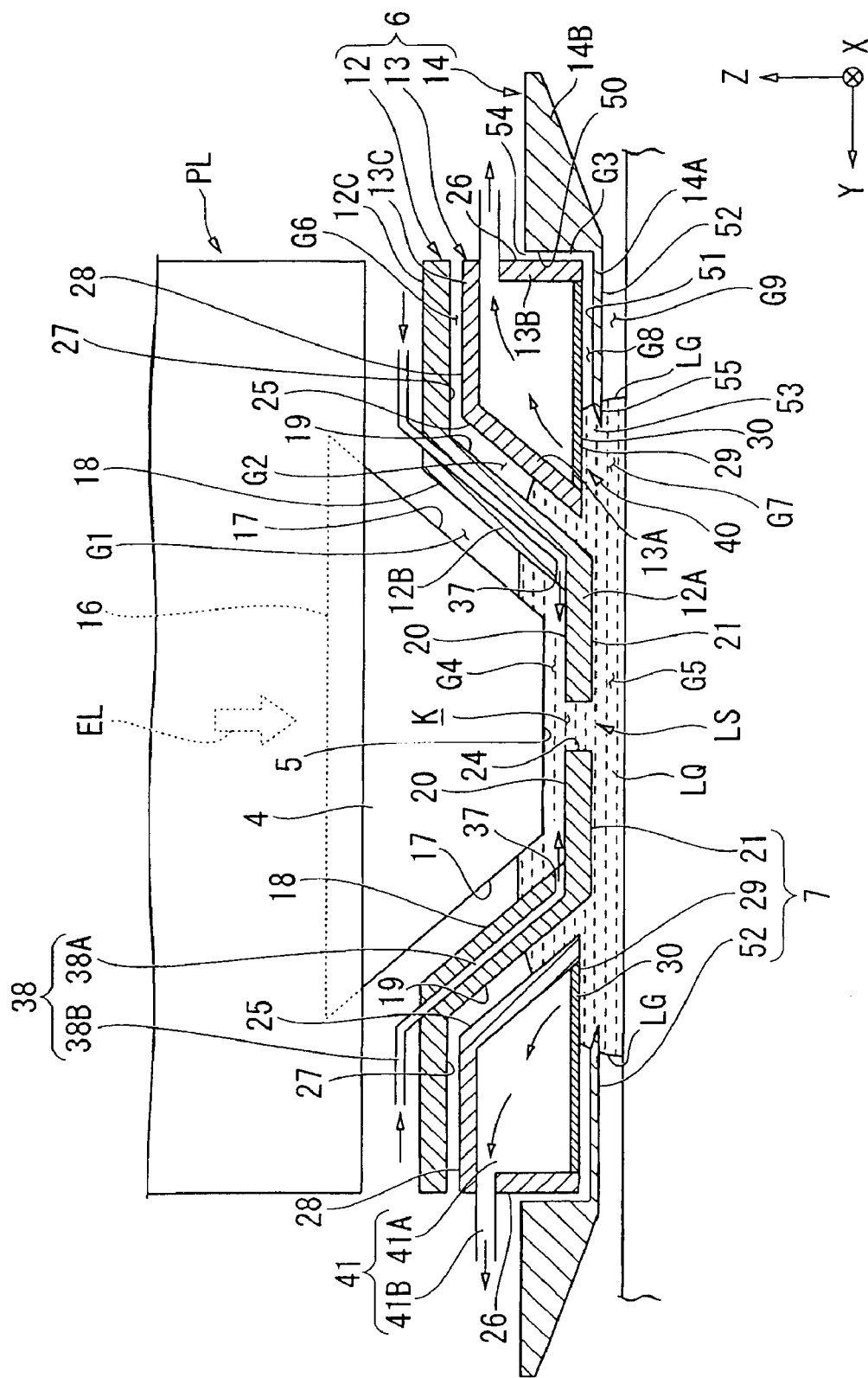
FIG. 2 is a side cross sectional view that shows the vicinity of an immersion member according to the first embodiment.
Figure 4:
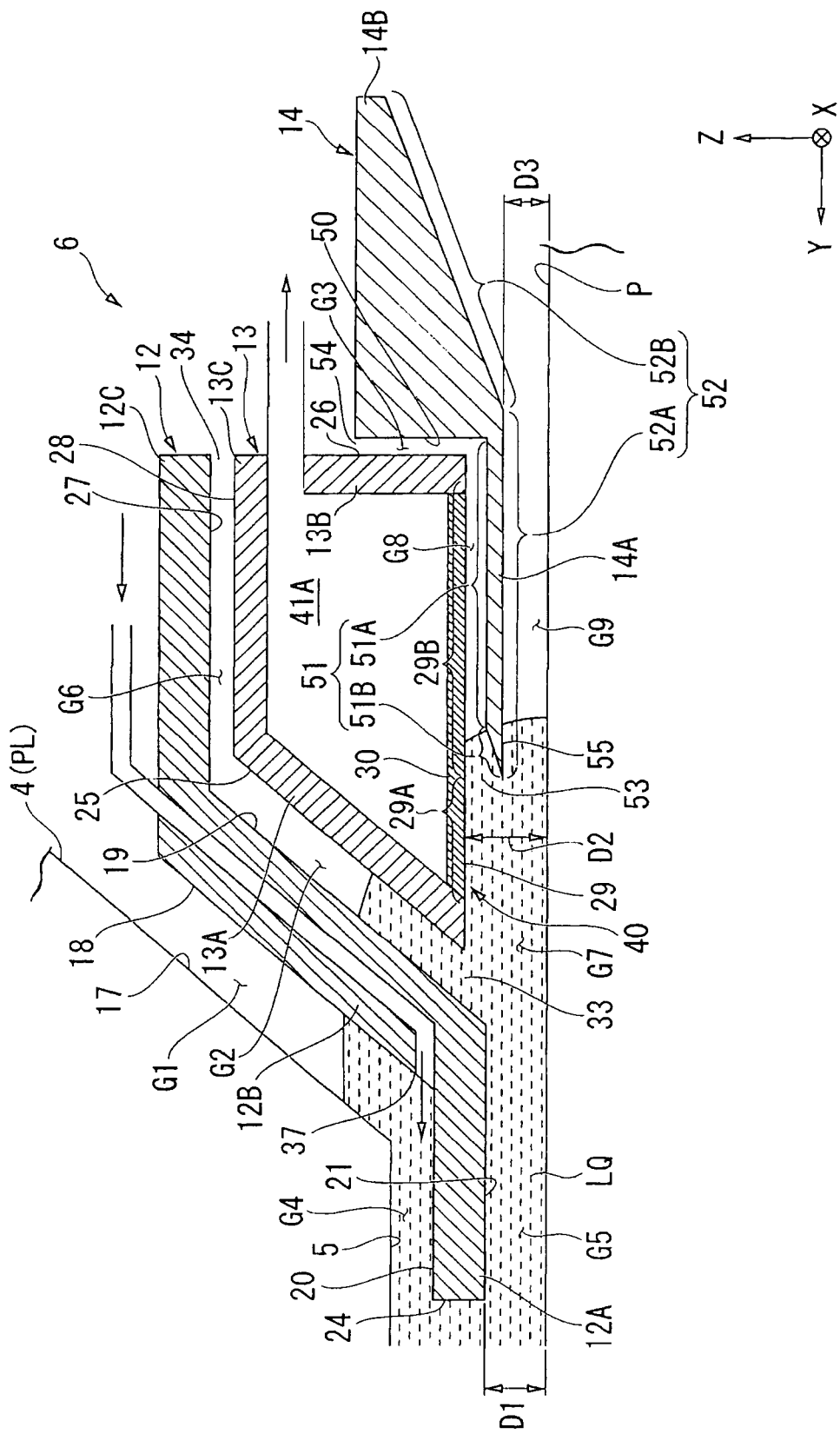
FIG. 4 is a partial enlarged side cross sectional view of the immersion member according to the first embodiment.

The following explains the liquid immersion member 6, the supply mechanism 8, and the recovery mechanism 9, referencing FIG. 1 through FIG. 4. FIG. 2 is a side cross sectional view that shows the vicinity of the liquid immersion member 6, FIG. 3 shows the liquid immersion member 6 viewed from the lower surface 7 side, and FIG. 4 is a partial enlarged view of the liquid immersion member 6.

Furthermore, the following explains an exemplary case wherein the substrate P is disposed at a position that opposes the lower surface 7 of the liquid immersion member 6 as well as the emergent surface 5 of the last optical element 4; however, as discussed above, an object other than the substrate P, such as the substrate stage 2, can also be disposed at a position that opposes the lower surface 7 of the liquid immersion member 6 as well as the emergent surface 5 of the last optical element 4. In addition, in the explanation below, the emergent surface 5 of the last optical element 4 is properly called the lower surface 5 of the last optical element 4.

In FIG. 1 through FIG. 4, the liquid immersion member 6 comprises a first member 12, a second member 13, and a third member 14. In the present embodiment, the first member 12, the second member 13, and the third member 14 are different members. The first member 12, the second member 13, and the third member 14 are annular members. In the present embodiment, the first member 12, the second member 13, and the third member 14 are supported by a support mechanism (not shown) with a prescribed positional relationship.

The first member 12 is disposed in the vicinity of the last optical element 4 so that it surrounds the optical path of the exposure light EL. In the present embodiment, the first member 12 is disposed on the outer side of the last optical element 4 with respect to the optical path of the exposure light EL so that it surrounds the last optical element 4 with a gap G1 interposed therebetween.

The second member 13 is disposed in the vicinity of the first member 12 so that it surrounds the optical path of the exposure light EL. In the present embodiment, at least part of the second member 13 is provided on the outer side of the first member 12 with respect to the optical path of the exposure light EL so that it surrounds the first member 12 with a gap G2 interposed therebetween.

The third member 14 is disposed in the vicinity of the second member 13 so that it surrounds the optical path of the exposure light EL. In the present embodiment, at last part of the third member 14 is provided on the outer side of the second member 13 with respect to the optical path of the exposure light EL so that it surrounds the second member 13 with a gap G3 interposed therebetween.

In the present embodiment, the last optical element 4 comprises an incident surface 16 that is impinged by the exposure light EL from the object plane of the projection optical system PL, the emergent surface (lower surface) 5, which emits the exposure light EL toward the image plane of the projection optical system PL, and an outer perimetric surface (side surface) 17, which connects the outer perimeter of the incident surface 16 to the outer perimeter of the emergent surface 5. In the present embodiment, the emergent surface (lower surface) 5 is substantially parallel to the XY plane. The outer perimetric surface 17 is inclined so that the distance between it and the front surface of the substrate P gradually increases as the distance between it and the optical path of the exposure light EL increases. In addition, in the present embodiment, the incident surface 16 is also substantially parallel to the XY plane, but it may be a curved surface that protrudes toward the object plane.

The first member 12 comprises an inner perimetric surface 18, which is formed along the outer perimetric surface 17 of the last optical element 4 and opposes such, an outer perimetric surface 19, which is disposed on the outer side of the inner perimetric surface 18 with respect to the last optical element 4, a first upper surface 20, which opposes part of the lower surface 5 of the last optical element 4, and a first lower surface 21, which opposes the front surface of the substrate P.

The first member 12 comprises a lower plate part 12A, at least one part of which is disposed in the Z axial directions between the lower surface 5 of the last optical element 4 and the front surface of the substrate P, a side plate part 12B, which is connected to the outer perimeter of the lower plate part 12A and is disposed so that it surrounds the outer perimetric surface 17 of the last optical element 4, and an upper plate part 12C, which is connected to the outer perimeter of the side plate part 12B at its upper end and is disposed so that it surrounds the outer perimetric surface 17 of the last optical element 4. The outer perimeter of the lower plate part 12A is connected to the inner perimeter of the side plate part 12B at its lower end.

Furthermore, in the present embodiment, the first member 12 is formed from a single member that comprises the lower plate part 12A, the side plate part 12B, and the upper plate part 12C; however, the lower plate part 12A, the side plate part 12B, and the upper plate part 12C may be formed from a plurality of members that are then connected to form the first member 12.

The inner perimetric surface 18 of the first member 12 includes one of the surfaces of the side plate part 12B and is disposed so that it opposes the outer perimetric surface 17 of the last optical element 4 with the gap G1 interposed therebetween. The outer perimetric surface 19 of the first member 12 includes another surface of the side plate part 12B and is substantially parallel to the inner perimetric surface 18. Furthermore, the inner perimetric surface 18 and the outer perimetric surface 19 do not have to be parallel.

In other words, in this embodiment, one end portion of the gap (annular gap) G1 is in fluid communication with the ambient space, and another end portion is in fluid communication with the liquid immersion space. In this embodiment, the communication of the gap G1 and the ambient space (e.g., atmosphere space) has the upper location (+Z) relative to the communication of the gap G1 and the liquid immersion space. At least a part of an inner end wall facing the gap G1 is the outer perimetric surface 17 of the last optical element 4. At least a part of an outer end wall facing the gap G1 is the inner perimetric surface 18 of the first member 12. That is, at least a part of the gap G1 is an interspace between the last optical element 4 and the first member 12. In this embodiment, each of the wall (17) and the wall (18) has a diameter which is widen along the upward direction (+Z), and the wall (17) and the wall (18) can be substantially parallel. As the diameter becomes larger, the volume of the gap G1 per unit length in the axial direction becomes larger toward upward (+Z). In another embodiment, the wall (17) and the wall (18) can be substantially non-parallel.

The first upper surface 20 of the first member 12 includes an upper surface of the lower plate part 12A and is disposed so that it opposes the lower surface 5 of the last optical element 4 with a gap G4 interposed therebetween. The first upper surface 20 is a flat surface that is substantially parallel to the XY plane.

The first lower surface 21 of the first member 12 includes a lower surface of the lower plate part 12A. For example, during the exposure of the substrate P, the front surface of the substrate P is disposed so that it opposes the first lower surface 21 with a gap G5 interposed therebetween. The first lower surface 21 is a flat surface that is substantially parallel to the XY plane (the front surface of the substrate P).

In addition, the lower plate part 12A comprises an opening 24 at its center. The exposure light EL that emerges from the lower surface 5 of the last optical element 4 can pass through the opening 24. For example, during the exposure of the substrate P, the exposure light EL that emerges from the lower surface 5 of the last optical element 4 passes through the opening 24 and is radiated to the front surface of the substrate P through the liquid LQ on the substrate P. In the present embodiment, the cross sectional shape of the exposure light EL in the opening 24 is substantially rectangular (slit shaped) with the longitudinal directions in the X axial directions. The opening 24 is formed in a substantially rectangular shape (a slit shape) in the X and Y directions in accordance with the cross sectional shape of the exposure light EL. In addition, the cross sectional shape of the exposure light EL in the opening 24 and the shape of the projection region PR of the projection optical system PL on the substrate P are substantially the same. The first upper surface 20 and the first lower surface 21 are formed around the opening 24. In addition, as shown in FIG. 3, in the present embodiment, the external shape of the first lower surface 21 is a rectangle (a square) that has sides that are parallel to the X axis and the Y axis.

The second member 13 comprises an inner perimetric surface 25, which is formed along the outer perimetric surface 19 of the first member 12 and opposes such, an outer perimetric surface 26, which is disposed on the outer side of the inner perimetric surface 25 with respect to the first member 12, an upper surface 28, which opposes a lower surface 27 of the upper plate part 12C of the first member 12, and a second lower surface 29, at least part of which opposes the front surface of the substrate P.

The second member 13 comprises an upper plate part 13C, which opposes the upper plate part 12C of the first member 12, an outer side plate part 13B, which is disposed so that it contacts the outer perimeter of the upper plate part 13C, and an inner side plate part 13A, which is disposed so that it contacts the inner perimeter of the upper plate part 13C. Furthermore, in the present embodiment, the second member 13 may be formed from a single member that comprises the inner side plate part 13A, the outer side plate part 13B, and the upper plate part 13C; however, the inner side plate part 13A, the outer side plate part 13B, and the upper plate part 13C may be formed from a plurality of members that are joined together to form the second member 13.

In addition, a porous member (mesh member) 30 is disposed in a portion of the second member 13 that opposes the front surface of the substrate P and at least part of the third member 14. In this embodiment, as the porous member 30, a plate on which pores (through-holes) are formed, a sintered member in which a plurality of pores are formed (for example, a sintered metal), foam member (for example, a foam metal), or the like can be used. In another embodiment, as the porous member 30, porous member other than those above can be used. In the present embodiment, the porous member 30 is disposed so that at least part of it opposes the front surface of the substrate P. The second lower surface 29 of the second member 13 includes a lower surface (suction region, recovery surface) of the porous member 30.

The inner perimetric surface 25 of the second member 13 includes an inner side surface of the inner side plate part 13A and is disposed so that it opposes the outer perimetric surface 19 of the first member 12 with the gap G2 interposed therebetween. In the present embodiment, the outer perimetric surface 19 of the first member 12 and the inner perimetric surface 25 of the second member 13 are substantially parallel. Furthermore, the outer perimetric surface 19 of the first member 12 and the inner perimetric surface 25 of the second member 13 do not have to be parallel.

The upper surface 28 of the second member 13 comprises the upper surface of the upper plate part 13C and is disposed so that it opposes the lower surface 27 of the upper plate part 12C of the first member 12 with a gap G6 interposed therebetween. The upper surface 28 of the second member 13 and the lower surface 27 of the upper plate part 12C of the first member 12 are flat surfaces that are substantially parallel to the XY plane.

The lower surface of the porous member 30 forms at least part of the second lower surface 29. In the present embodiment, part of the lower surface of the porous member 30 opposes the front surface of the substrate P. That is, a part of the second lower surface 29 of the second member 13 including the lower surface (suction region, recovery surface) of the porous member 30 can face the surface of the substrate P. For example, during the exposure of the substrate P, the front surface of the substrate P is disposed so that it opposes at least part of the second lower surface 29 (the lower surface of the porous member 30) with a gap G7 interposed therebetween. In the present embodiment, the second lower surface 29 is a flat surface that is substantially parallel to the XY plane. In another embodiment, the second lower surface 29 can be substantially non-parallel to the XY plane.

In addition, as shown in FIG. 3, in the present embodiment, the lower surface of the porous member 30 is formed in a rectangular frame shape that has sides that are parallel to the X axis and the Y axis.

The third member 14 opposes (faces) the outer perimetric surface 26 of the second member 13, and comprises: an inner perimetric surface 50, which is formed so that it follows the outer perimetric surface 26; a third upper surface 51, which opposes (faces) part of the second lower surface 29 (part of the lower surface of the porous member 30); and a third lower surface 52, which opposes (faces) the front surface of the substrate P.

The third member 14 comprises: a lower plate part 14A, at least one part of which is disposed in the Z axial directions between the second lower surface 29 and the front surface of the substrate P; and a side plate part 14B, which is connected to the outer perimeter of the lower plate part 14A and is disposed so that it surrounds the outer perimetric surface 26 of the second member 13.

Furthermore, in the present embodiment, the third member 14 is formed from a single member that comprises the lower plate part 14A and the side plate part 14B; however, the lower plate part 14A and the side plate part 14B may be formed from a plurality of members that are then connected to form the third member 14.

The inner perimetric surface 50 of the third member 14 includes an inner perimetric surface of the side plate part 14B and is disposed so that it opposes the outer perimetric surface 26 of the second member 13 with the gap G3 interposed therebetween. The inner perimetric surface 50 of the third member 14 is substantially parallel to the outer perimetric surface 26 of the second member 13. Furthermore, the inner perimetric surface 50 and the outer perimetric surface 26 do not have to be parallel.

The lower plate part 14A has an upper surface and a lower surface that is on the side opposite the upper surface. The third upper surface 51 comprises the upper surface of the lower plate part 14A, and the third lower surface 52 comprises the lower surface of the lower plate part 14A and the lower surface of the side plate part 14B. The third upper surface 51 and the third lower surface 52 are disposed so that they surrounds the optical path of the exposure light EL.

The third lower surface 52 comprises a flat part 52A, which is substantially parallel to the XY plane, and an inclined part 52B, which is inclined so that the distance between it and the front surface of the substrate P gradually increases as the distance between it and the optical path of the exposure light EL increases. The flat part 52A is disposed on the exposure light EL optical path side of the lower surface 52 so that it surrounds the optical path of the exposure light EL. The inclined part 52B is disposed on the outer side of the flat part 52A with respect to the optical path of the exposure light EL so that it surrounds the optical path of the exposure light EL. In addition, the position of an outer edge of the flat part 52A in the Z axial directions and the position of the inner edge of the inclined part 52B in the Z axial directions are the same. In another embodiment, the flat part 52A can be substantially non-parallel to the XY plane.

The third upper surface 51 comprises an inclined part 51B, which is inclined with respect to the flat part 52A of the third lower surface 52, and a flat part 51A, which is parallel to the flat part 52A of the third lower surface 52. In the present embodiment, the flat surface 51A of the third upper surface 51 is substantially parallel to the XY plane. In another embodiment, the flat part 51 can be substantially non-parallel to the XY plane.

The inclined part 51B of the third upper surface 51 is disposed on the exposure light EL optical path side of the third upper surface 51 so that it surrounds the optical path of the exposure light EL. The inclined part 51B of the third upper surface 51 is inclined so that the distance between itself and the front surface of the substrate P increases gradually as the distance between itself and the optical path of the exposure light EL increases. In the present embodiment, the angle that is formed by the inclined part 51B of the third upper surface 51 and the flat part 52A of the third lower surface 52 is an acute angle. The flat part 51A of the third upper surface 51 is disposed on the outer side of the inclined part 51B with respect to the optical path of the exposure light EL so that it surrounds the optical path of the exposure light EL. The position of the outer edge of the inclined part 51B in the Z axial directions and the position of the inner edge of the flat part 51A in the Z axial directions are the same.

Here, in the explanation below, an apical portion of the acute angle formed by the inclined part 51B of the third upper surface 51 and the flat part 52A of the third lower surface 52 is properly called a pointed end part 55. The pointed end part 55 points toward the optical path of the exposure light EL.

In this embodiment, the distal end of the end part 55 (i.e., the edge of the third upper surface 51 of the third member 14, or the distal end portion of a region of the third member 14, facing the second member 13) is closer to the substrate P than the first lower surface 21 of the first member 12. That is, the height of the distal end from the substrate is lower than that of the first lower surface 21 of the first member 12.

A part of the flat part 51A of the third upper surface 51 is disposed so that it opposes the second lower surface 29 with a gap G8 interposed therebetween. In addition, during the exposure of the substrate P for example, the front surface of the substrate P is disposed so that it opposes the flat part 52A of the third lower surface 52 with a gap G9 interposed therebetween.

In the explanation below, the gap G8 between the second lower surface 29 and the third upper surface 51 is properly called the first gap G8. In addition, the gap G2 between the outer perimetric surface 19 of the first member 12 and the inner perimetric surface 25 of the second member 13 is properly called the second gap G2.

In this embodiment, the inside edge of the third upper surface 51 of the third member 14 is parallel to the outer shape of the first lower surface 21 of the first member 12. That is, as shown in FIG. 3, the inside edge of the third upper surface 51 has a shape similar to the outer shape of the first lower surface, and the shape is a rectangular shape (square). Alternatively, the inside edge of the third upper surface 51 can have a shape non-similar to the outer shape of the first lower surface 21.

In the present embodiment, the second lower surface 29 (the lower surface of the porous member 30) comprises a first area 29A, which does not oppose the third upper surface 51, and a second area 29B, which opposes the third upper surface 51. The first area 29A is disposed on the exposure light EL optical path side of the second lower surface 29 so that it surrounds the optical path of the exposure light EL. The second area 29B is disposed on the outer side of the first area 29A with respect to the optical path of the exposure light EL so that it surrounds the optical path of the exposure light EL.

In other word, in this embodiment, the second lower surface 29 of the second member 13 (or the lower surface of the porous member 30) can have a larger area than the third upper surface 51 of the third member 14. In this embodiment, the third member 14 locally covers the second lower surface 29 of the second member 13. The third member 14 covers the area (the second area 29B) at the radially outward region on the second lower surface 29 of the second member 13. In the second lower surface 29 of the second member 13, the area 29B, which is covered by the third member 14, is hidden from the substrate P. In the second lower surface 29, the area (the first area 29A), which is uncovered by the third member 14, is at the radially inward region. The uncovered area 29A is closer to the optical path of the exposure light than the covered area 29B. The uncovered area can front the substrate P.

In this embodiment, the inside edge of the third upper surface 51 of the third member 14 is provide parallel to the inside edge of the porous member 30 (the connection portion of the inner side plate part 13A and the porous member 30). That is, as shown in FIG. 3, the inside edge of the third upper surface 51 has a shape similar to the shape of the inner edge of the porous member 30, and the shape is a rectangular shape (square). Alternatively, the inside edge of the third upper surface 51 can have a shape non-similar to the shape of the inner edge of the porous member 30.

In the present embodiment, the lower surface 7 of the liquid immersion member 6 comprises the first lower surface 21, the second lower surface 29, and the third lower surface 52. The first lower surface 21 is disposed so that it surrounds the optical path of the exposure light EL. The second lower surface 29 is disposed on the outer side of the first lower surface 21 with respect to the optical path of the exposure light EL so that it surrounds the optical path of the exposure light EL and the first lower surface 21. The third lower surface 52 is disposed on the outer side of the first area 29A of the second lower surface 29 with respect to the optical path of the exposure light EL so that it surrounds the optical path of the exposure light EL, the first lower surface 21, and the first area 29A of the second lower surface 29. In other words, the second lower surface 29 and the third lower surface 52 are disposed radially outside the first lower surface 21, and the third lower surface 52 is disposed radially outside the part (i.e., the first area 29A) of the second lower surface 29

As shown in FIG. 4, in the present embodiment, a distance D3 (the size of the gap G9) between the flat part 52A of the third lower surface 52 and the front surface of the substrate P is smaller than a distance D1 (the size of the gap G5) between the first lower surface 21 and the front surface of the substrate P. In addition, the distance D1 (the size of the gap G5) between the first lower surface 21 and the front surface of the substrate P is smaller than a distance D2 (the size of the gap G7) between the second lower surface 29 and the front surface of the substrate P.

When the substrate P is disposed at a position that opposes the lower surface 7 of the liquid immersion member 6, the liquid immersion member 6 can hold the liquid LQ between at least the first lower surface 21 and the front surface of the substrate P. In the present embodiment, at least the first lower surface 21 of the first member 12 is formed from, for example, titanium and is lyophilic with respect to the liquid LQ. For example, the contact angle between the first lower surface 21 and the liquid LQ can be less than or equal to 90°, 80°, 70°, 60°, 50°, 40°, 30°, 20°, or 10°. The contact angle preferably be less than or equal to 40°, and more preferably be less than or equal to 200. The first lower surface 21, which is lyophilic with respect to the liquid LQ and is substantially parallel to the front surface (the XY plane) of the substrate P, can continue to contact the liquid LQ of the immersion space LS even if the substrate P is moved in the X and Y directions. At least during the exposure of the substrate P, the first lower surface 21 is a liquid contact surface that contacts the liquid LQ of the immersion space LS.

In addition, the first area 29A of the second lower surface 29 is capable of contacting the liquid LQ on the substrate P, and the liquid immersion member 6 can hold the liquid LQ between the first area 29A of the second lower surface 29 and the front surface of the substrate P when the substrate P is disposed at a position that opposes the lower surface 7 of the liquid immersion member 6. In addition, the second area 29B of the second lower surface 29 is capable of contacting the liquid LQ that flows into the first gap G8. In addition, in the present embodiment, at least the portion of the second member 13 that contacts the liquid LQ is formed from, for example, titanium, and is lyophilic with respect to the liquid LQ. For example, the contact angle between the second lower surface 29 and the liquid LQ can be less than or equal to 90°, 80°, 70°, 60°, 50°, 40°, 30°, 20°, or 10°. The contact angle preferably be less than or equal to 40°, and more preferably be less than or equal to 20°.

In addition, the third lower surface 52 is capable of contacting the liquid LQ on the substrate P, and the liquid immersion member 6 can hold the liquid LQ between the third lower surface 52 and the front surface of the substrate P when the substrate P is disposed at a position that opposes the lower surface 7 of the liquid immersion member 6. In the present embodiment, the flat part 52A of the third lower surface 52 is liquid repellent with respect to the liquid LQ, and the inclined part 52B of the third lower surface 52 is lyophilic with respect to the liquid LQ. In addition, the third upper surface 51, which includes the flat part 51A and the inclined part 51B, is lyophilic with respect to the liquid LQ. In the present embodiment, the third member 14 is formed from titanium, and a film of a material that is liquid repellent with respect to the liquid LQ, such as a material that includes fluorine, is formed on the flat part 52A of the third lower surface 52. The third upper surface 51 and the inclined part 52B of the third lower surface 52 are formed from titanium. For example, the contact angle between the flat part 52A of the third lower surface 52 and the liquid LQ can be greater than or equal to 100°, 110°, 120°, 130°, or 140°. The contact angle more preferably be 110° or greater. In addition, the contact angle between the third upper surface 51 and the liquid LQ and the contact angle between the inclined part 52B of the third lower surface 52 and the liquid LQ both can be less than or equal to 90°, 80°, 70°, 60°, 50°, 40°, 30°, 20°, or 10°. The contact angle preferably be less than or equal to 40°, and more preferably be less than or equal to 20°. Furthermore, the flat part 52A of the third lower surface 52 does not have to be liquid repellent.

FIG. 2 and FIG. 4 show a state wherein part of the liquid LQ on the substrate P is held between the substrate P and: the first lower surface 21; part of the area of the second lower surface 29; as well as part of the area of the third lower surface 52. For example, during the exposure of the substrate P, the immersion space LS is formed by holding the liquid LQ between the front surface of the substrate P and the lower surface 7 of the liquid immersion member 6, which comprises the first lower surface 21, the second lower surface 29, and the third lower surface 52.

A first opening 53 is formed between the second lower surface 29 and the third upper surface (sharp end portion) 51. As shown in FIG. 2 and FIG. 4, the first opening 53 is disposed at a position at which it can contact the liquid LQ (the liquid LQ of the immersion space LS) on the substrate P, and the liquid LQ on the substrate P is capable of flowing into the first opening 53. The first opening 53 is connected to the first gap G8. The first gap G8 is provided so that the liquid LQ on the substrate P can flow into the first gap G8 via the first opening 53.

The first opening 53 is provided between an edge of the lower plate part (sharp end portion) 14A of the third member 14 and the porous member 30. Namely, the first opening 53 is disposed in the vicinity of the boundary between the first area 29A and the second area 29B. The first opening 53 is slit-shaped and is provided annularly so that surrounds the optical path of the exposure light EL. The first gap G8 is annularly provided along the first opening 53 on the outer side thereof with respect to the optical path of the exposure light EL. In the present embodiment, the inclined part 51B is formed along an edge of the lower plate part 14A, and the width of the first opening 53 (the distance in the Z axial directions between the inclined part 51B of the third upper surface 51 and the second lower surface 29) is slightly greater than the distance in the Z axial directions between the flat part 51A of the third upper surface 51 and the second lower surface 29.

The first gap G8 is open to the atmosphere via a second opening 54, which is different from the first opening 53. The second opening 54 is disposed at a position at which it can contact a gas in an external space (the ambient environment) that surrounds the liquid immersion member 6 (the immersion space LS), and that gas can flow into the second opening 54. The first gap G8 is provided so that the gas of the external space can flow into it via the second opening 54.

The second opening 54 is provided at a position at which the liquid LQ (the liquid LQ of the immersion space LS) on the substrate P cannot flow into it.

In the present embodiment, the second opening 54 is disposed on the outer side of the first opening 53 and the first gap G8 with respect to the optical path of the exposure light EL and at a position at which it does not oppose the front surface of the substrate P. The second opening 54 is disposed on the +Z side of the first opening 53.

In the present embodiment, the second opening 54 is formed between the outer perimetric surface 26 of the second member 13 and the upper end of the inner side surface 50 of the third member 14, and is connected to the gap G3. The gap G3 is provided so that the gas of the external space can flow into it via the second opening 54. In addition, in the present embodiment, the first gap G8 is connected (is integral with) the gap G3, and the second opening 54 is connected to the first gap G8 via the gap G3. In other words, the gap G3 is substantially opened to the atmosphere, and the gap G8 is substantially opened to the atmosphere via the gap G3.

In the present embodiment, the first opening 53, the second opening 54, and the gaps G8, G3 are each provided between the second member 13 and the third member 14.

In other words, in this embodiment, both at least a portion of the gap G8 (annular gap) and at least a portion of the gap G3 (annular gap) are the interspace between the second member 13 (the porous member 30) and the third member 14. In this embodiment, one end portion of a space including the gap G8 and the gap G3 is in fluid communication with the ambient space, and another end portion is in fluid communication with the liquid immersion space. In this embodiment, the gap G8 and the gap G2 have the upper location (+Z) communicated with the external space than with the liquid immersion space. In this embodiment, the gap G8 having a predetermined width is extended in the substantially horizontal direction, and the gap G3 having a predetermined width is extended in the substantially vertical direction. The radially outer end of the gap G8 is in fluid communication with the lower end of the gap G3. At least a part of an upper wall facing the gap G8 is the second lower surface 29 (the lower surface of the porous member 30) of the second member 13. A lower wall facing the gap G8 is the third upper surface 51 of the third member 14. In this embodiment, the wall (29) and the wall (51A) can be substantially parallel. In another embodiment, the wall (29) and the wall (51A) can be substantially non-parallel. At least a part of an inner wall facing the gap G2 is the outer perimetric surface 26 of the second member 13. At least a part of an outer wall facing the gap G2 is the inner perimetric surface 50 of the third member 14. In this embodiment, the wall (26) and the wall (50) can be substantially parallel. In another embodiment, the wall (26) and the wall (50) can be substantially non-parallel.

The gas of the external space is capable of flowing into the gaps G8, G3 through the second opening 54, and the gas in the gaps G8, G3 is capable of flowing out to the external space through the second opening 54. In the present embodiment, the gas can continuously flow back and forth between the first gap G8 and the external space (the atmospheric space) on the outer side of the first gap G8 via a second opening 54, and therefore the first gap G8 is in a state wherein it is open to the atmosphere via the second opening 54.

The state wherein the first gap G8 is open to the atmosphere includes the state wherein the first gap G8 is continuously in communication with the gas space that surrounds the liquid immersion member 6 (i.e., that surrounds the immersion space LS). For example, even if the entire area of the first opening 53 is covered with the liquid LQ of the immersion space LS in the state wherein the first gap G8 is open to the atmosphere, the gas can still flow back and forth between the first gap G8 and the external space (the ambient environment) through the second opening 54. Furthermore, the exposure apparatus EX is disposed in a continuously environmentally controlled chamber, and the "open to the atmosphere" state discussed above includes the state wherein the first gap G8 is in communication with the gas space inside the chamber. In addition, the gas of the external space is not necessarily air and it may be, for example, nitrogen.

A third opening 33 is formed between the first lower surface 21 and the second lower surface 29. As shown in FIG. 2 and FIG. 4, the third opening 33 is disposed at a position at which it can contact the liquid LQ (the liquid LQ of the immersion space LS) on the substrate P, and the liquid LQ on the substrate P can flow into the third opening 33. The third opening 33 is connected to the second gap G2. The second gap G2 is provided so that the liquid LQ on the substrate P can flow into the second gap G2 via the third opening 33.

The third opening 33 is disposed at a lower end of the second gap G2, and the front surface of the substrate P is capable of moving to a position that opposes the third opening 33. The third opening 33 is slit shaped and is provided annularly so that it surrounds the first lower surface 21. As shown in FIG. 3, in the present embodiment, the third opening 33 is provided annularly in the shape of a rectangle. In addition, the second gap G2 is also provided annularly along the third opening 33 so that it surrounds the first member 12.

The second gap G2 is open to the atmosphere via a fourth opening 34, which is different from the third opening 33. The fourth opening 34 is disposed at a position at which it can contact the gas of the external space (the ambient environment) that surrounds the liquid immersion member 6 (the immersion space LS), and that gas can flow into the fourth opening 34. The second gap G2 is provided so that the gas of the external space can flow into it via the fourth opening 34.

The fourth opening 34 is not capable of contacting the liquid LQ (the liquid LQ of the immersion space LS) on the substrate P. Namely, the fourth opening 34 is provided at a position at which the liquid LQ on the substrate P, which opposes the third opening 33, does not flow into the fourth opening 34.

In the present embodiment, the fourth opening 34 is disposed on the outer side of the third opening 33 and the second gap G2 with respect to the optical path of the exposure light EL and at a position at which it does not oppose the front surface of the substrate P. The fourth opening 34 is disposed on the +Z side of the third opening 33.

In the present embodiment, the fourth opening 34 is formed between the outer perimeter of the lower surface 27 of the upper plate part 12C of the first member 12 and the outer perimeter of the upper surface 28 of the second member 13, and is connected to the gap G6. The gap G6 is provided so that the gas of the external space can flow into it via the fourth opening 34. In addition, in the present embodiment, the second gap G2 and the gap G6 are connected (integral), and the fourth opening 34 is connected to the second gap G2 via the gap G6.

The gas of the external space is capable of flowing into the gaps G2, G6 via the fourth opening 34, and the gas in the gaps G2, G6 is capable of flowing out to the external space via the fourth opening 34. In the present embodiment, the gas can continuously flow back and forth between the second gap G2 and the external space (atmospheric space) on the outer side of the second gap G2 via the fourth opening 34, and therefore the second gap G2 is in a state wherein it is open to the atmosphere via the fourth opening 34.

In the present embodiment, the third opening 33, the fourth opening 34, and the gaps G2, G6 are each provided between the first member 12 and the second member 13.

In other words, in this embodiment, at least a part of the second gap (annular gap) G2 is the interspace between the first member 12 and the second member 13. In this embodiment, one end portion of the gap G2 is in fluid communication with the ambient space, and another end portion is in fluid communication with the liquid immersion space. In this embodiment, the communication of the gap G2 and the ambient space (e.g., atmosphere space) has the upper location (+Z) relative to the communication of the gap G2 and the liquid immersion space. At least a part of an inner end wall facing the gap G2 is the outer perimetric surface 19 of the first member 12. At least a part of an outer end wall facing the gap G2 is the inner perimetric surface 25 of the second member 13. In this embodiment, each of the wall (19) and the wall (25) has a diameter which is widen along the upward direction (+Z), and the wall (19) and the wall (25) can be substantially parallel. As the diameter becomes larger, the volume of the gap G1 per unit length in the axial direction becomes larger toward upward (+Z). In another embodiment, the wall (19) and the wall (25) can be substantially non-parallel.

Furthermore, the first member 12 and the second member 13 may be disposed so that they contact one another, in which case the third opening 33, the fourth opening 34, and the gaps G2, G6 do not need to be provided.

The supply mechanism 8 comprises a liquid supply apparatus 36, which is capable of feeding the pure, temperature adjusted liquid LQ, supply ports 37, which are disposed in the vicinity of the optical path space K, and passageways 38, which connect the liquid supply apparatus 36 and the supply ports 37.

In the present embodiment, the supply ports 37 are formed in the first member 12. Each passageway 38 comprises a supply passageway 38A, which is formed inside the first member 12, and a passageway 38B, which is formed from a supply pipe that connects the supply passageway 38A and the liquid supply apparatus 36. The liquid LQ that is fed from the liquid supply apparatus 36 is supplied to each supply port 37 through the corresponding passageway 38. The supply ports 37 supply the liquid LQ from the liquid supply apparatus 36 to the optical path space K.

In the present embodiment, the supply ports 37 are connected to the gap G4 between the lower surface 5 of the last optical element 4 and the first upper surface 20 and are capable of supplying the liquid LQ to the gap G4. In addition, in the present embodiment, the supply ports 37 are provided on opposite sides of the optical path space K in the Y axial directions, one on each side. Furthermore, the supply ports 37 may be provided on opposite sides of the optical path space K in the X axial directions, one on each side.

In the present embodiment, the supply ports 37 are disposed on the inner side of the first opening 53 and the third opening 33 with respect to the optical path of the exposure light EL.

The recovery mechanism 9 comprises a liquid recovery apparatus 39, which includes a vacuum system and is capable of recovering the liquid LQ by suction, a recovery part 40, which is capable of recovering the liquid LQ, and a passageway 41, which connects the liquid recovery apparatus 39 and the recovery part 40.

The recovery part 40 includes a suction port that is capable of recovering the liquid LQ by suction. In the present embodiment, the recovery part 40 is disposed in one portion of the second member 13 that is capable of opposing the front surface of the substrate P and the third upper surface 51. Namely, in the present embodiment, the recovery part 40 is disposed in the second lower surface 29. The recovery part 40 is disposed so that part of it opposes the third upper surface 51 with the first gap G8 interposed therebetween.

In the present embodiment, a suction passageway (space, suction passageway) 41A, which comprises an opening that opposes the front surface of the substrate P and the third upper surface 51, is formed in the second member 13 by the inner side plate part 13A, the upper plate part 13C, and the outer side plate part 13B, and the recovery part 40 is disposed in the opening of the space 41A. In the present embodiment, the recovery part 40 is provided annularly along the first gap G8.

The recovery part 40 comprises a porous member (mesh member) 30, which is disposed so that it covers the suction port. As discussed above, the lower surface of the porous member 30 forms at least part of the second lower surface 29 that opposes the front surface of the substrate P and the third upper surface 51. In the present embodiment, part of the area (the second area 29B) of the lower surface of the porous member 30 of the recovery part 40 opposes the third upper surface 51 with the first gap G8 interposed therebetween.

The recovery mechanism 9 recovers the liquid LQ on the substrate P that opposes the lower surface 7 of the liquid immersion member 6—including the third lower surface 52—via the recovery part 40. In the present embodiment, the passageway 41 comprises the suction passageway 41A, which is formed inside the second member 13, and a passageway 41B, which is formed from a recovery pipe that connects the suction passageway 41A and the liquid recovery apparatus 39. Driving the liquid recovery apparatus 39, which includes the vacuum system, generates a pressure differential between the upper surface and the second lower surface 29 of the porous member 30, and the liquid LQ is thereby suctioned by the porous member 30 (the recovery part 40). The liquid LQ suctioned via the recovery part 40 is recovered by the liquid recovery apparatus 39 through the passageway 41.

The recovery part 40 recovers at least part of the liquid LQ that contacts the porous member 30 via the porous member 30. The recovery part 40 is capable of recovering the liquid LQ that contacts the first area 29A of the porous member 30.

The recovery part 40 is capable of recovering the liquid LQ that flows into the first gap G8 via the first opening 53 and contacts the second area 29B of the porous member 30. In the present embodiment, at least part of the liquid LQ between the lower surface 7 of the liquid immersion member 6 and the front surface of the substrate P can flow into the first gap G8 via the first opening 53. The first gap G8 is provided so that the liquid LQ on the substrate P can flow into the first gap G8 via the first opening 53. In addition, the first gap G8 is open to the atmosphere via the second opening 54, and therefore the liquid LQ can flow smoothly into the first gap G8 via the first opening 53. The recovery part 40 can suction at least part of the liquid LQ that flows into the first gap G8 through the first opening 53 via the porous member 30.

In the present embodiment, the first gap G8 forms a capillary passage into which the liquid LQ on the substrate P can flow. The spacing between the lower surface of the porous member 30 and the third upper surface 51 is 0.5-2.0 mm. The liquid LQ that contacts the first opening 53 is drawn into the first gap G8 by capillary action, contacts the surface of the second area 29B of the porous member 30, and is recovered via the porous member 30.

In the present embodiment, the third upper surface 51 is lyophilic with respect to the liquid LQ, and therefore the liquid LQ can be smoothly flow into the first gap G8 via the first opening 53.

In addition, in the recovery mechanism 9 of the present embodiment, liquid recovery conditions, which include the size of the holes of the porous member 30, the surface tension of the liquid LQ with respect to the porous member 30, and the pressure of the suction passageway 41A with respect to the pressure of the first gap G8 (the pressure of the external space), are set so as to prevent the gas that contacts the lower surface of the porous member 30 from passing through the porous member 30, as disclosed in, for example, PCT International Publication WO2005/024517, and U.S. Patent Application Publication No. 2007/0222959. Namely, in the present embodiment, the liquid recovery conditions are set so that only the liquid LQ that contacts the lower surface of the porous member 30 passes through the porous member 30 and flows into the suction passageway 41A, and therefore the gas that contacts the lower surface of the porous member 30 substantially does not pass through the porous member 30. In other words, the recovery part 40 of the present embodiment only suctions (recovers) the liquid LQ and does not suction the gas. Accordingly, even if the interface LG between the liquid LQ and the gas exists between the porous member 30 and the lower plate part 14A of the third member 14 as shown in FIG. 2, FIG. 4, and the like, the gas does not flow into the recovery passageway 41 via the porous member 30.

In the present embodiment, the recovery part 40 only suctions the liquid LQ through the porous member 30, and therefore can prevent, for example, the generation of vibrations and heat of vaporization.

The following explains a method of using the exposure apparatus EX that has the abovementioned configuration to perform an immersion exposure on the substrate P.

To form the immersion space LS, the control apparatus 3 supplies the liquid LQ to the optical path space K of the exposure light EL using the supply mechanism 8. When the liquid LQ is to be supplied, the control apparatus 3 disposes the object, such as the substrate P (the substrate stage 2), at a position that opposes the lower surface 7 of the liquid immersion member 6 and the lower surface 5 of the last optical element 4. The liquid LQ that is fed from the liquid supply apparatus 36 is supplied to each of the supply ports 37 through the corresponding passageway 38. The supply ports 37 supply the liquid LQ to the gap G4 between the lower surface 5 of the last optical element 4 and the upper surface 20. The liquid LQ flows through the gap G4 between the lower surface 5 of the last optical element 4 and the first upper surface 20, flows into the gap G5 between the first lower surface 21 and the front surface of the substrate P via the opening 24, and is held between the first lower surface 21 and the front surface of the substrate P. In addition, at least part of the liquid LQ flows into the gap G7 between the second lower surface 29 and the front surface of the substrate P and is held between the second lower surface 29 and the front surface of the substrate P. In addition, at least part of the liquid LQ flows into the gap G9 between the third lower surface 52 and the front surface of the substrate P and is held between the third lower surface 52 and the front surface of the substrate P.

In so doing, the immersion space LS is formed so that the gap G4 and the gap G5 are filled with the liquid LQ and so that the optical path space K between the lower surface 5 of the last optical element 4 and the front surface of the substrate P is filled with the liquid LQ.

In addition, in the present embodiment, the control apparatus 3 performs the liquid recovery operation with the recovery mechanism 9 in parallel with the liquid supply operation with the supply mechanism 8. At least part of the liquid LQ on the substrate P contacts the first area 29A of the porous member 30 of the recovery part 40 and is suctioned via the porous member 30. In addition, at least part of the liquid LQ on the substrate P flows through the first opening 53 into the first gap G8. The liquid LQ on the substrate P flows into the first gap G8 by, for example, capillary action. Inside the first gap G8, the liquid LQ that contacts the lower surface of the porous member 30 of the recovery part 40 (the second area 29B of the lower surface of the porous member 30) is suctioned via the porous member 30. The liquid LQ that is suctioned by the recovery part 40 is recovered through the passageway 41 by the liquid recovery apparatus 39.

The control apparatus 3 performs the liquid supply operation with the supply mechanism 8 and the liquid recovery operation with the recovery mechanism 9 in parallel, and therefore can continuously and locally form an immersion area on the substrate P with the liquid LQ that has desired conditions (e.g., temperature and cleanliness level).

After the immersion space LS has been formed, the control apparatus 3 starts the exposure of the substrate P. As discussed above, the exposure apparatus EX of the present embodiment is a scanning type exposure apparatus. The control apparatus 3 radiates the exposure light EL to the substrate P through the projection optical system PL and the liquid LQ on the substrate P while the front surface of the substrate P moves in one of the Y axial directions with respect to the optical path of the exposure light EL and the immersion space LS in a state wherein the immersion space LS is formed by holding the liquid LQ between the lower surface 7 of the liquid immersion member 6 and the front surface of the substrate P. Thereby, the image of the pattern of the mask M is projected onto the substrate P, which is thereby exposed with the exposure light EL.

In addition, in order to start the exposure of a second shot region after the exposure of, for example, a first shot region on the substrate P is complete, the control apparatus 3 performs an operation that moves the front surface of the substrate P in one of the X axial directions (or a direction that is inclined with respect to the X axial directions within the XY plane) in a state wherein the immersion space LS is formed.

In the present embodiment, even if the front surface of the substrate P is moved in the X and Y directions, the liquid LQ between the lower surface 7 of the liquid immersion member 6 and the front surface of the substrate P does not leak to the outer side of the space between the lower surface 7 of the liquid immersion member 6 and the front surface of the substrate P.

Figure 5A:
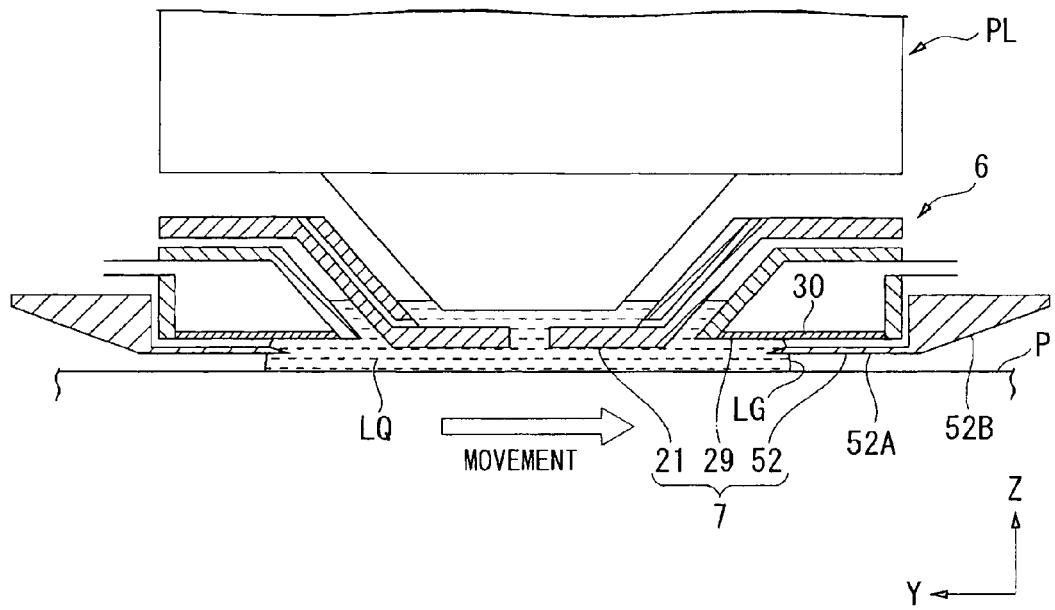
FIG. 5A shows one example of the operation of the exposure apparatus according to the first embodiment.
Figure 5B:
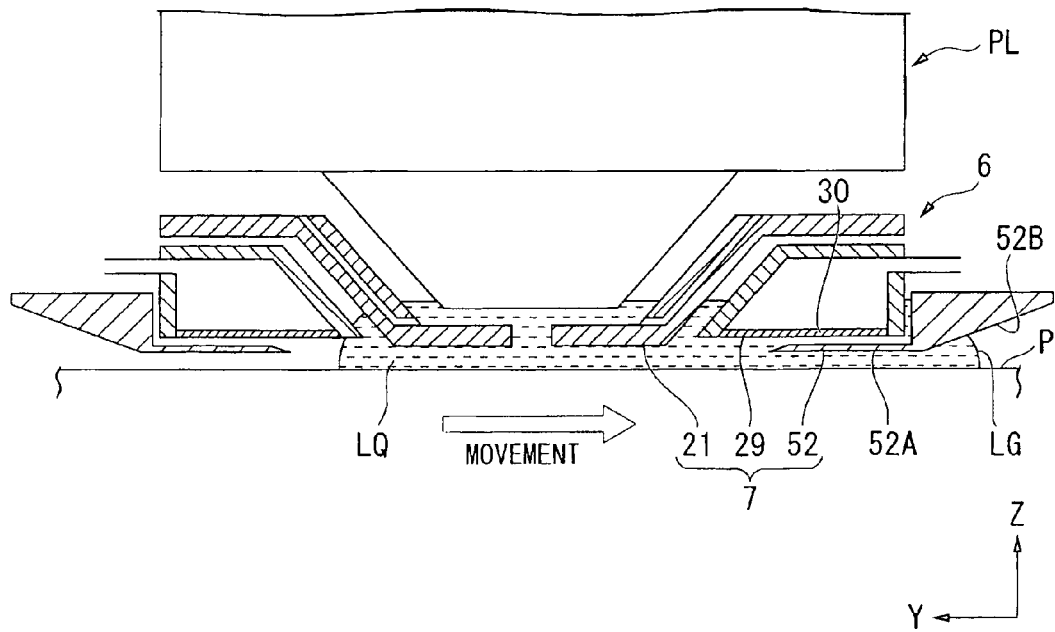
FIG. 5B shows one example of the operation of the exposure apparatus according to the first embodiment.

FIGS. 5A and 5B include schematic drawings that show the state wherein the front surface of the substrate P has moved in one of the Y axial directions with respect to the optical path of the exposure light EL and the immersion space LS; therein, FIG. 5A shows the state wherein the substrate P has moved at a first speed, and FIG. 5B shows the state wherein the substrate P has moved at a second speed, which is faster than the first speed. As shown in FIGS. 5A and 5B, in the present embodiment, exposure conditions are set so that the interface (meniscus, edge) LG of the liquid LQ in the immersion space LS is formed between the front surface of the substrate P and the lower surface 7 of the liquid immersion member 6 not only while the substrate P is stationary, but also while it is moved. In the present embodiment, the exposure conditions are set so that the interface LG of the liquid LQ contacts at least one of the second lower surface 29 and the third lower surface 52 even during the movement of the substrate P. The exposure conditions include movement conditions of the substrate P and immersion conditions for forming the immersion space LS. The movement conditions of the substrate P include its travel speed, acceleration, deceleration, distance of movement in one of the prescribed directions (for example, in the +Y direction), and travel direction. The immersion conditions include the amount of liquid LQ supplied per unit of time by the supply ports 37.

In the present embodiment, the third member 14 (the lower plate part 14A) is disposed so that it opposes at least part of the recovery part 40, and the liquid LQ that contacts the first area 29A of the lower surface of the porous member 30 flows into the first gap G8 via the first opening 53 while the liquid LQ that contacts the second area 29B of the lower surface of the porous member 30 is suctioned via the porous member 30. Thereby, even if the substrate P moves in the X and Y directions with respect to the immersion space LS, it is possible to prevent, for example, the liquid LQ from leaking or remaining on the front surface of the substrate P (for example, as a film or a drop).

Thus, the provision of the third member 14, which is disposed between the recovery part 40 and the substrate P so that it opposes at least part of the recovery part 40, is in accordance with the findings of the inventors, as described below.

Figure 6A:
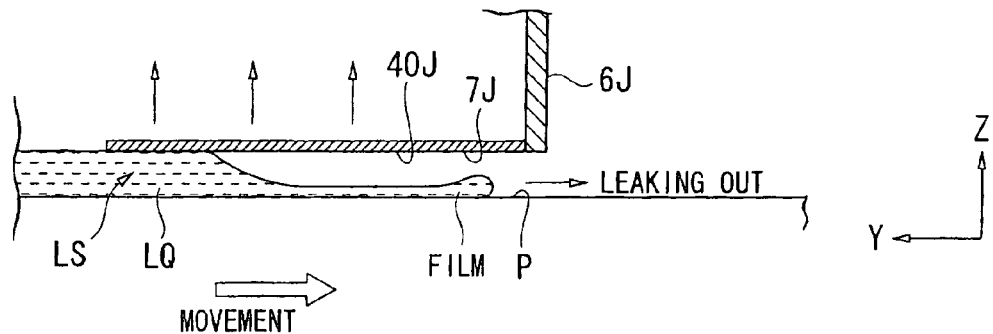
FIG. 6A is a schematic drawing for explaining the action of the immersion member; and shows a case wherein an immersion member of a comparative example is used.

FIG. 6A is a schematic drawing that shows the state wherein a recovery part (porous member) 40J that recovers the liquid LQ of the immersion space LS is disposed in a lower surface 7J, which opposes the front surface of the substrate P, of a liquid immersion member 6J. In FIG. 6A, a member that opposes the recovery part 40J is not disposed between the recovery part 40 and the substrate P, and the entire area of the recovery part 40J opposes the front surface of the substrate P. If the liquid immersion member 6J is used and the substrate P is moved at high speed in one direction (here, the −Y direction) within the XY plane with respect to the immersion space LS (the liquid immersion member 6J), then there are cases wherein the liquid LQ between the recovery part 40J and the substrate P will form a thin film on the substrate P, or wherein the liquid LQ on the substrate P will leak to the outer side of the recovery part 40J at the outer side of the recovery part 40J, specifically the front side (the −Y side) of the substrate P in its direction of travel. This phenomenon occurs because the liquid LQ in the vicinity of the lower surface 7J of the liquid immersion member 6J, i.e., the vicinity of the recovery part 40J, between the lower surface 7J of the liquid immersion member 6J and the front surface of the substrate P flows upward (in the +Z direction) due to the suction operation of the recovery part 40J, and is then recovered by the recovery part 40J, while the liquid LQ that is in the vicinity of the front surface of the substrate P is not fully recovered by the recovery part 40J as a result of, for example, surface tension with respect to the substrate P, and therefore forms a thin film on the substrate P and, as the substrate P moves, is drawn to the outer side of the recovery part 40J at the front side of the substrate P in its travel direction. If such a phenomenon occurs, then the liquid LQ that is drawn to the outer side of the recovery part 40J forms, for example, a drop that remains on the substrate P, which leads to pattern defects and the like. Furthermore, such a phenomenon tends to occur as the travel speed of the substrate P increases, which further clarifies the findings of the inventor.

Figure 6B:
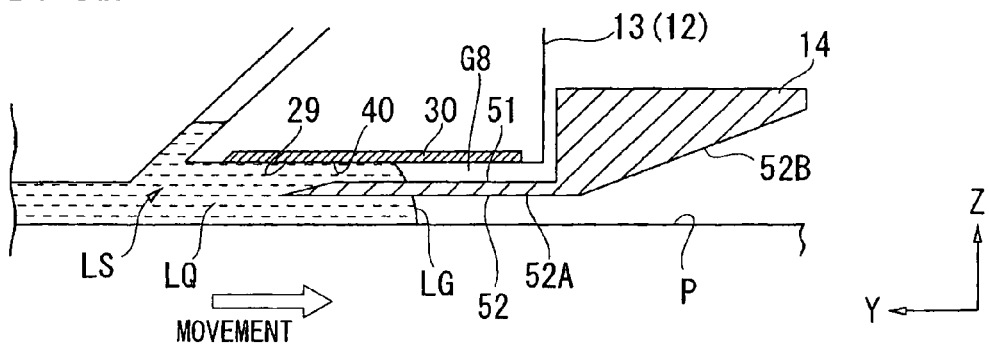
FIG. 6B is a schematic drawing for explaining the action of the immersion member according to the first embodiment.

FIG. 6B is a schematic drawing that shows the liquid immersion member 6 according to the present embodiment. In the present embodiment, the third member 14 is disposed between the recovery part 40 and the substrate P so that it opposes part of the recovery part 40, and therefore a strong upward (+Z direction) flow of the liquid LQ does not arise in the vicinity of the lower surface 7 of the liquid immersion member 6 (the vicinity of the second lower surface 29). Namely, in the present embodiment, the third member 14, which is disposed so that it opposes part of the recovery part 40, prevents the strong suction force of the recovery part 40 from acting upon the liquid LQ on the substrate P.

In addition, the first gap G8 is open to the atmosphere and the inflow of the liquid LQ from the first opening 53 to the first gap G8 depends entirely on the capillary force of the first gap G8, and therefore a strong flow of the liquid LQ upwards (in the +Z direction) does not arise even in the vicinity of the first opening 53. In addition, the third lower surface 52 is disposed on the outer side of the first area 29A with respect to the optical path of the exposure light EL, and therefore the liquid LQ that is not recovered by the recovery part 40 is held between the third lower surface 52 and the front surface of the substrate P. Accordingly, even if the substrate P moves at high speed in one direction (in the −Y direction) within the XY plane with respect to the immersion space LS (the liquid immersion member 6), the use of the liquid immersion member 6 according to the present embodiment prevents the phenomenon wherein the liquid LQ forms a thin film on the substrate P at the front side (the −Y side) of the substrate P in its travel direction, and the interface LG maintains the desired state between the front surface of the substrate P and: the second lower surface 29; as well as the third lower surface 52. Namely, even if the substrate P is moved, the liquid LQ between the lower surface 7 of the liquid immersion member 6 and the front surface of the substrate P is prevented from separating from the lower surface 7. Thus, in the present embodiment, the liquid LQ between the lower surface 7 and the front surface of the substrate P contacts the lower surface 7, and therefore the interface LG of the liquid LQ is maintained in the desired state even at the front side (the −Y side) of the substrate P in its travel direction. Accordingly, the liquid LQ is prevented from, for example, leaking to the outer side of the space between the liquid immersion member 6 and the substrate P or remaining on the substrate P (as drops or the like). In this embodiment, a part (the first area 29A) of the lower surface of the porous member 30 is uncovered by the third member 13 and is revealed, and therefore the movement of the interface LG along with the movement of the substrate P is inhibited, and the remaining of the liquid LQ on the substrate P is inhibited.

Figure 6C:
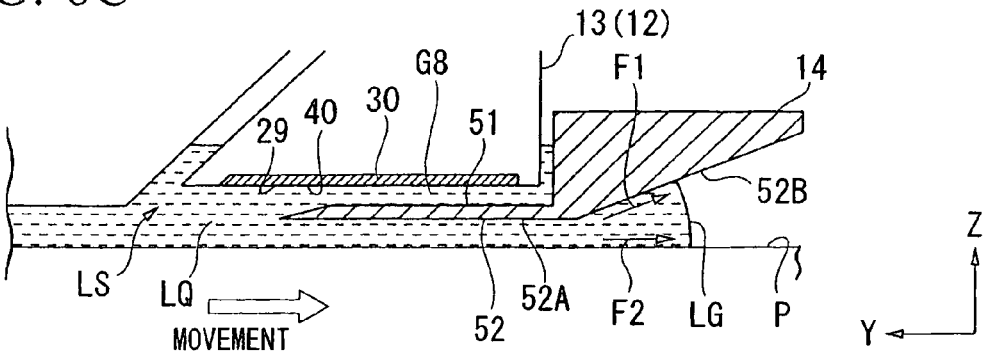
FIG. 6C is a schematic drawing for explaining the action of the immersion member according to the first embodiment.

FIG. 6C shows the state of the immersion space LS when the substrate P has been moved at high speed in the −Y direction with respect to the immersion space LS, which is formed using the liquid immersion member 6 according to the present embodiment. In some movement conditions of the substrate P and the like, the interface LG may move to the radially outside the flat part 52A of the third lower surface 52 along with the movement of the substrate P. In the present embodiment, the third lower surface 52 has the inclined part 52B at radially outside the flat part 52A, and therefore a component F1, which moves diagonally upward along the inclined part 52B, and a component F2, which moves in a horizontal direction, are generated in the liquid LQ of the immersion space LS. In addition, it is possible to increase the volume of the space between the substrate P and the lower surface 52. Accordingly, it is possible to prevent the enlargement of the immersion space LS. Furthermore, the inclination angle of the inclined part 52B of the third lower surface 52 with respect to the XY plane (the flat part 51A) is of course adjusted so that the liquid LQ between the third lower surface 52 and the substrate P does not separate from the third lower surface 52.

Figure 6D:
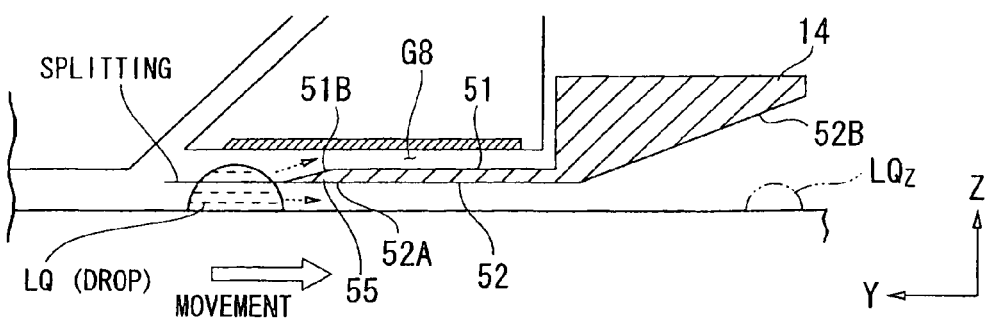
FIG. 6D is a schematic drawing for explaining the action of the immersion member according to the first embodiment.

In addition, the liquid immersion member 6 according to the present embodiment comprises a pointed end part 55, which is formed by the inclined part 51B of the third upper surface 51 and the flat part 52A of the third lower surface 52; therefore, even if a drop of the liquid LQ is formed on the substrate P as shown in FIG. 6D for example, that drop of the liquid LQ can be split by the pointed end part 55. The pointed end part 55 is disposed at a position at which it is closer to the substrate P in the Z axial directions than the emergent surface 5, the first lower surface 21, and the second lower surface 29, and can split a drop of the liquid LQ on the substrate P that moves from an area that opposes at least one of the emergent surface 5, the first lower surface 21, and the first area 29A of the second lower surface 29 toward the pointed end part 55. The pointed end part 55 can split a drop of the liquid LQ into at least two drops. The liquid LQ that contacts and is split by the pointed end part 55 and moves thereabove then moves into the first gap G8 via the first opening 53 and is recovered by the recovery part 40 via the porous member 30. Furthermore, there is a possibility that a drop of the liquid LQ (refer to a symbol LQz in FIG. 6D) will not be recovered by the recovery part 40 after it contacts the pointed end part 55 and will remain between the third member 14 and the substrate P. It is conceivable that this drop LQz of the liquid LQ is a microdrop that enters the space between the third member 14 and the substrate P after being split by the pointed end part 55. In addition, there is also a possibility that the drop LQz of the liquid LQ that remains on the substrate P is a microdrop that has entered the space between the third member 14 and the substrate P without contacting the pointed end part 55. If the liquid LQ remains on the substrate P, then there is a possibility that defects will occur in the pattern that is formed on the substrate P, but there is a possibility that defects will not occur in the pattern if the drop LQz of the liquid LQ that remains is minute. Consequently, the provision of the pointed end part 55 makes it possible to prevent the generation of pattern defects.

As explained above, the present embodiment can recover the liquid LQ satisfactorily and can prevent the liquid LQ from, for example leaking out or remaining on the substrate P, and therefore can prevent exposure failures from occurring. In addition, the travel speed of the substrate P can be increased while preventing exposure failures from occurring. Accordingly, satisfactory devices can be fabricated with good productivity.

Figure 7:
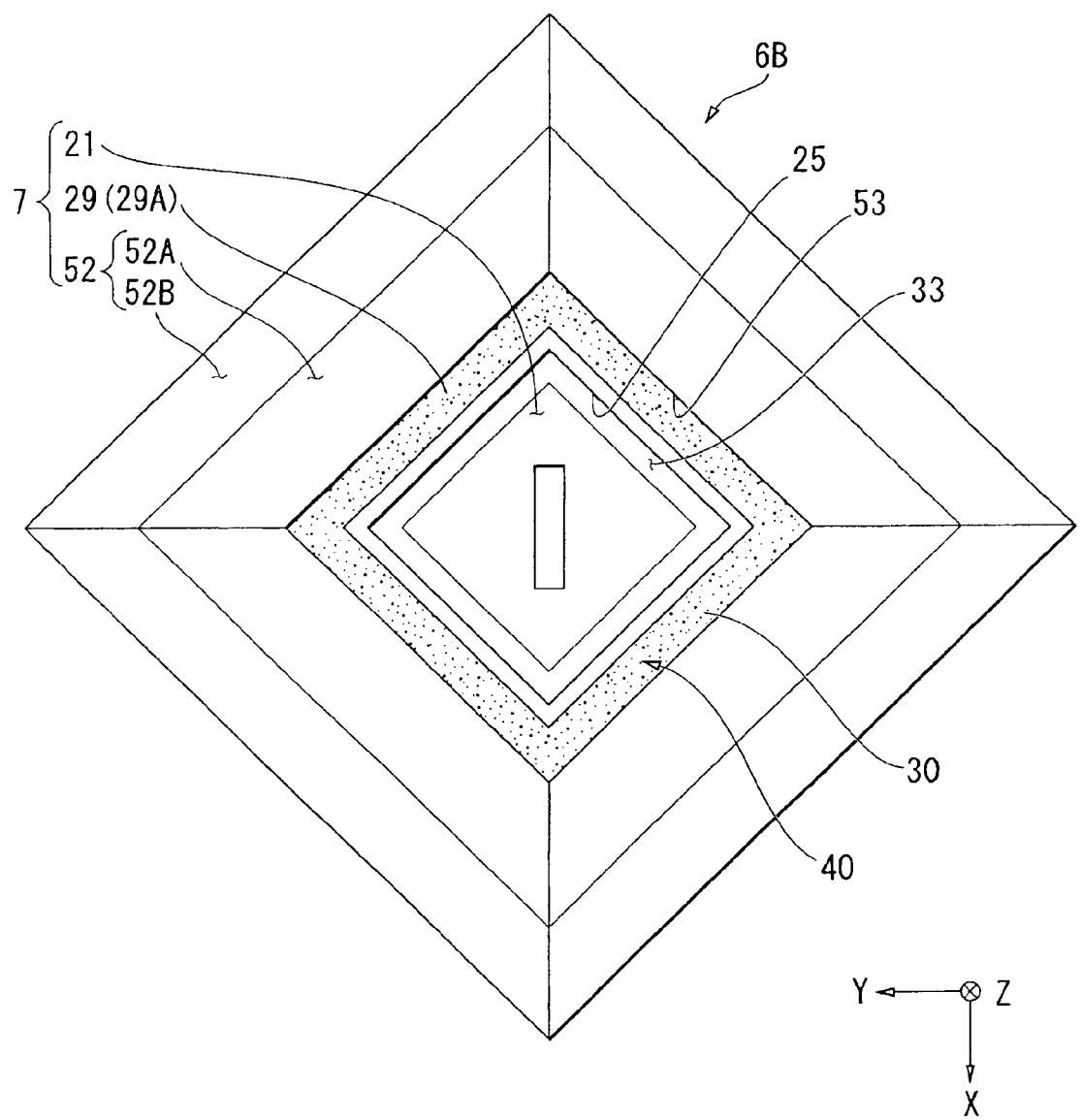
FIG. 7 shows a separate example of the immersion member according to the first embodiment, viewed from below.

Furthermore, in the present embodiment, the external shape of the liquid immersion member 6 in the XY plane is a rectangle (square shape) with sides that are substantially parallel to the X axis and the Y axis as shown in, for example, FIG. 3; however, as shown in FIG. 7, the external shape of a liquid immersion member 6B in the XY plane may be a rectangle (square shape) with sides that are inclined with respect to the X axis and the Y axis. In FIG. 7, the liquid immersion member 6B comprises the substantially rectangular (slit shaped) opening 24, the longitudinal directions of which are set in the X axial directions, and the first lower surface 21, which is a rectangle (square shape) with sides that are inclined within the XY plane at approximately 45° with respect to the X axis and the Y axis. In addition, the external shapes of the second lower surface 29 and the lower surface 52 in the XY plane are rectangles (square shapes) that have sides that are inclined at approximately 45° with respect to the X axis and the Y axis.

Furthermore, the external shape of the liquid immersion member in the XY plane may be circular.

Furthermore, in the present embodiment, the liquid immersion member 6 includes a plurality of members, i.e., the first member 12, the second member 13, and the third member 14; however, this plurality of members may be formed integrally, or arbitrary members of the plurality of members may be joined to one another.

Second Embodiment

The following explains a second embodiment. In the explanation below, constituent parts that are identical or equivalent to those in the embodiment discussed above are assigned identical symbols, and the explanations thereof are therefore abbreviated or omitted.

Figure 8:
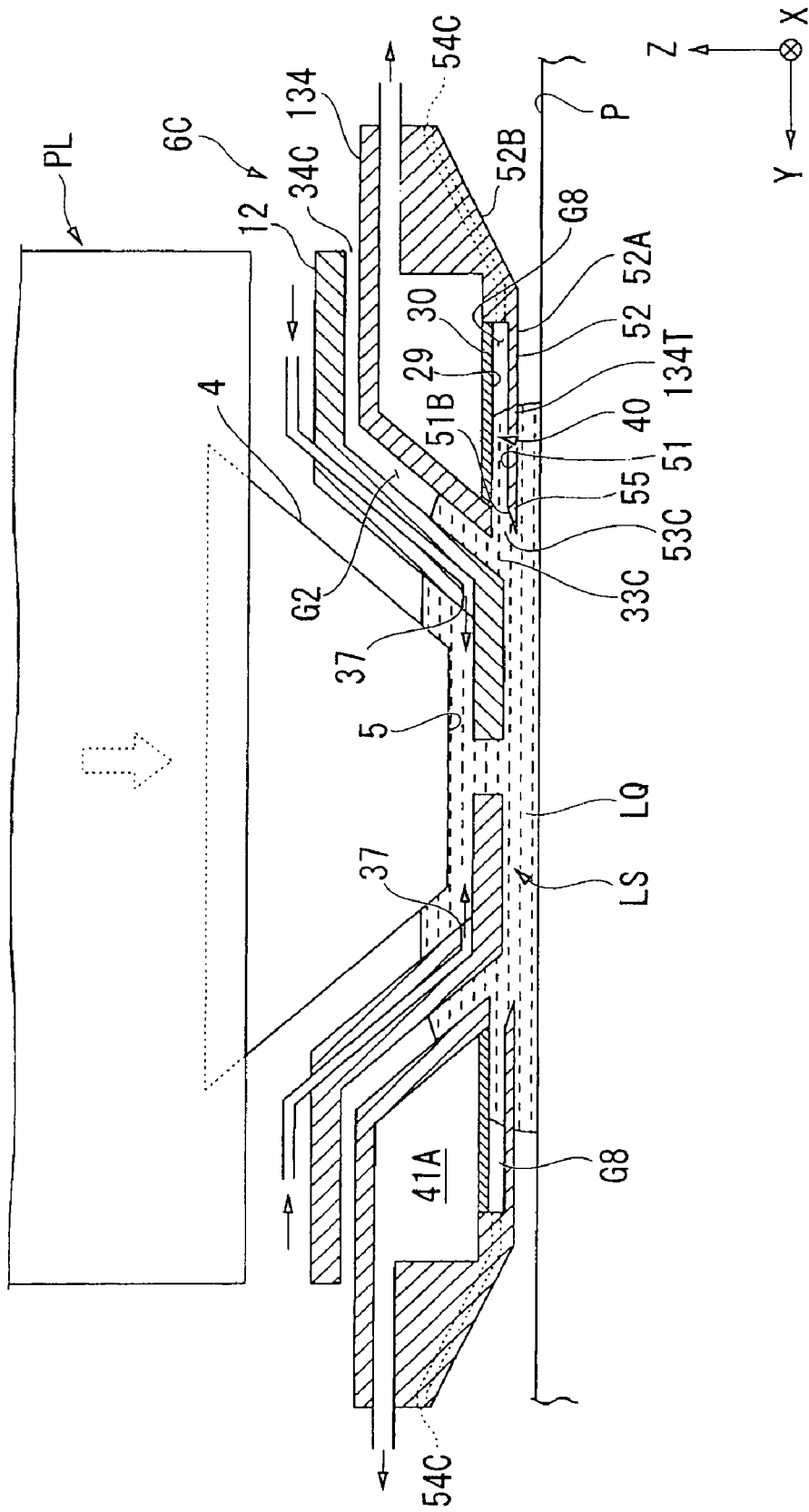
FIG. 8 is a side cross sectional view that shows the vicinity of an immersion member according to a second embodiment.
Figure 9:
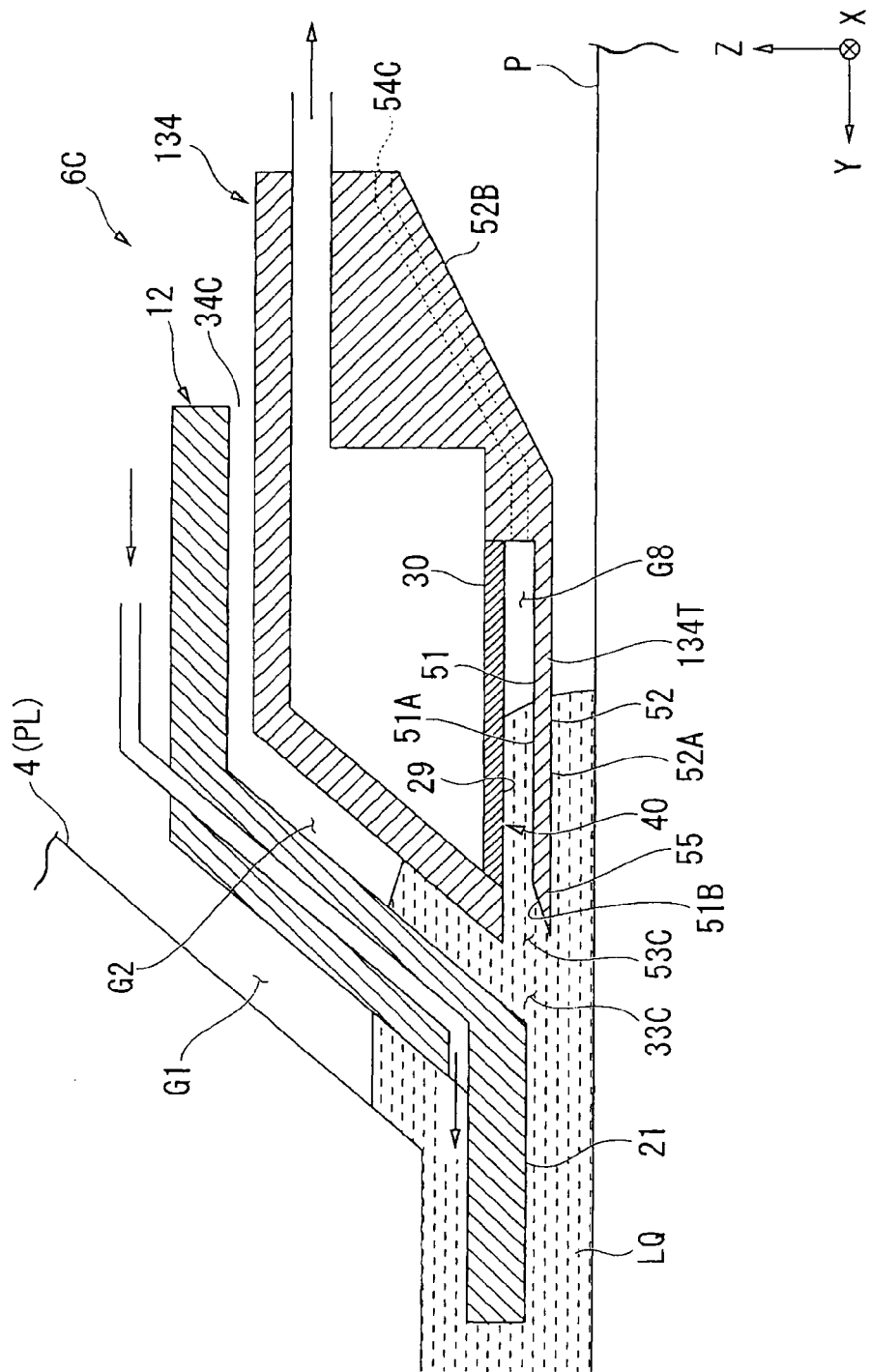
FIG. 9 is a partial enlarged side cross sectional view of the immersion member according to the second embodiment.

FIG. 8 is a side cross sectional view that shows the vicinity of a liquid immersion member 6C according to the second embodiment, and FIG. 9 is a partial enlarged view of the liquid immersion member 6C. The characteristic feature of the present embodiment is that the entire area of the recovery part 40 and the third upper surface 51 oppose one another. Furthermore, the present embodiment explains an exemplary case wherein the recovery part 40 and the third upper surface 51 are formed in a singular fourth member 134; however, similar to the first embodiment discussed above, the member that has the recovery part 40 and the member that has the third upper surface 51 may be different members.

As shown in FIG. 8 and FIG. 9, in the present embodiment, the liquid immersion member 6C comprises: the first member 12, which has the first lower surface 21; and the fourth member 134, which has the recovery part 40 and is disposed in the vicinity of the first member 12 so that it surrounds the first member 12. The fourth member 134 comprises: the second lower surface 29, wherein the recovery part 40 is disposed; and the third upper surface 51, which is disposed so that it opposes the entire area of the recovery part 40 that is disposed in the second lower surface 29. The first gap G8 is formed between the lower surface of the porous member 30 of the recovery part 40 and the third upper surface 51. The third upper surface 51 comprises the flat part 51A and the inclined part 51B, and the third lower surface 52 on the side opposite the third upper surface 51 comprises the flat part 52A and the inclined part 52B. The fourth member 134 comprises: the third upper surface 51, which includes the flat part 51A and the inclined part 51B; and a plate part 134T, which forms the flat part 52A of the third lower surface 52. The pointed end part 55 is formed by the inclined part 51B of the third upper surface 51 and the flat part 52A of the third lower surface 52.

The liquid immersion member 6C comprises a first opening 53C, which contacts the first gap G8. The first opening 53C is formed between the second lower surface 29 and the edge of the third upper surface 51 on the exposure light EL optical path side. The first gap G8 is open to the atmosphere via the second opening 54C.

A third opening 33C is formed between the first member 12 and the fourth member 134. The third opening 33C is disposed between the first lower surface 21 of the first member 12 and the third lower surface 52 of the fourth member 134. The third opening 33C is disposed at a position at which it can contact the liquid LQ (the liquid LQ of the immersion space LS) on the substrate P, and the liquid LQ on the substrate P can flow into the third opening 33C. The third opening 33C contacts the second gap G2. The second gap G2 is provided so that the liquid LQ on the substrate P can flow into the second gap G2 via the third opening 33C. The third opening 33C is disposed at a lower end of the second gap G2, and the front surface of the substrate P is capable of moving to a position at which is opposes the third opening 33.

The second gap G2 is open to the atmosphere via a fourth opening 34C, which is different from the third opening 33C. The fourth opening 34C is disposed at a position at which it can contact gas in an external space (the ambient environment) that surrounds the liquid immersion member 6 (the immersion space LS), and the gas of the external space can flow into the fourth opening 34C. The fourth opening 34C is disposed at a position at which it is incapable of contacting the liquid LQ (the liquid LQ of the immersion space LS) on the substrate P. The second gap G2 is provided so that the gas of the external space can flow into the second gap G2 via the fourth opening 34C. In the present embodiment, the fourth opening 34C is formed between the first member 12 and the fourth member 134.

The liquid LQ on the substrate P can flow from the third opening 33C into the first gap G8 between the lower surface of the porous member 30 and the third upper surface 51 via the first opening 53C. The liquid LQ on the substrate P that opposes the first lower surface 21 and the third lower surface 52 can flow from the third opening 33C into the first gap G8 via the first opening 53C. In the present embodiment, the second gap G2, into which the liquid LQ on the substrate P can flow via the third opening 33C, and the first gap G8 are connected via the first opening 53C, and the liquid LQ that flows into the third opening 33C can flow into the first gap G8 via the first opening 53C. The liquid LQ that flows into the first gap G8 is recovered by the recovery part 40, which includes the porous member 30.

In the present embodiment as well, it is possible to recover the liquid LQ satisfactorily and to prevent the liquid LQ from, for example, leaking out or remaining on the substrate P, which makes it possible to prevent the exposure failures from occurring. In addition, the travel speed of the substrate P can be increased while preventing exposure failures from occurring. Accordingly, satisfactory devices can be fabricated with good productivity.

Furthermore, in the first and second embodiments discussed above, the third upper surface 51 and the third lower surface 52 may be movable with respect to the first lower surface 21 and the second lower surface 29. In this case, as in the first embodiment discussed above, the member that has the third upper surface 51 and the third lower surface 52 may be provided by a member that is different from the member that has the first lower surface 21 and the second lower surface 29. In addition, the member that has the third upper surface 51 and the third lower surface 52 may be provided so that it is movable passively, or it may be provided so that it is moved actively using a drive mechanism. Furthermore, the liquid immersion member 6 may be movable with respect to the last optical element 4.

Furthermore, in the first and second embodiments discussed above, the distance D1 between the first lower surface 21 and the front surface of the substrate P and the distance D2 between the second lower surface 29 and the front surface of the substrate P may be the same. In addition, the distance D1 between the first lower surface 21 and the front surface of the substrate P and the distance D3 between the flat part 52A of the third lower surface 52 and the front surface of the substrate P may be the same.

Furthermore, in each of the embodiments discussed above, the inclined part 52B of the third lower surface 52 is formed from the four flat surfaces that face different directions, but they may be curved surfaces. Alternatively, the inclined part 52B may be formed by combining five or more flat surfaces.

Furthermore, in each of the embodiments discussed above, the flat part 51A of the third upper surface 51 and the flat part 52A of the third lower surface 52 are parallel to the XY plane, but they may be inclined with respect to the XY plane. In addition, the flat part 51A of the third upper surface 51 and the flat part 52A of the third lower surface 52 do not have to be parallel.

Furthermore, in each of the embodiments discussed above, a step may be formed in, for example, part of the third lower surface 52.

Furthermore, in each of the embodiments discussed above, the first member 12 may be omitted and a liquid supply port may be provided to the second member 13. In this case, the inner perimetric surface 25 of the second member 13 opposes an outer perimetric surface of the last optical element 4. In addition, in each of the embodiments discussed above, the recovery part 40 (the porous member 30) is provided continuously and annularly, but multiple recovery parts 40 (porous members 30) may be disposed so that they are dispersed around the exposure light EL. The liquid immersion member 6 of the kind disclosed in, for example, PCT International Publication WO2006/106851 can be adapted to the exposure apparatus EX of the present embodiment. In this case as well, the lower plate part 14A of the third member 14 should be disposed so that it covers part of every recovery part 40 (porous member 30).

Furthermore, in each of the embodiments discussed above, the liquid recovery part can be additionally provided at the third lower surface 52 (the flat part 52A).

Furthermore, in each of the embodiments discussed above, the term of "annular" can include a substantially rectangular shaped annular. Alternatively or also, "annular" can include various shapes such as a substantially rectangular shaped annular, a substantially ring shaped annular, a substantially circular shaped annular, a substantially polygon shaped annular, and the like.

Furthermore, in each of the embodiments discussed above, the optical path space on the emergent side (the image plane side) of the last optical element 4 of the projection optical system PL is filled with the liquid LQ, but it is also possible to adopt a projection optical system wherein the optical path space on the incident side (the object plane side) of the last optical element 4 is also filled with the liquid LQ, as disclosed in PCT International Publication WO2004/019128.

Furthermore, although the liquid LQ in the embodiments discussed above is water, it may be a liquid other than water. It is preferable to use a liquid that is transparent to the exposure light EL, has as high a refractive index as possible, and is stable with respect to the projection optical system PL or the film of the photosensitive material (the photoresist) that forms the front surface of the substrate P as the liquid LQ. It is also possible to use hydro-fluoro-ether (HFE), perfluorinated polyether (PFPE), Fomblin oil, cedar oil, or the like as the liquid LQ. In addition, a liquid that has a refractive index of approximately 1.6 to 1.8 may be used as the liquid LQ. Furthermore, the optical element (the last optical element 4 or the like) of the projection optical system PL that contacts the liquid LQ may for example be formed from quartz (silica), or from fluorite, barium fluoride, strontium fluoride, lithium fluoride, sodium fluoride, or single-crystal materials of other fluoride compounds. Furthermore, the terminus optical element may be formed from materials with a refractive index higher than that of quartz or fluorite (for example 1.6 or higher). As materials with a refractive index of 1.6 or higher, for example, sapphire, germanium dioxide or similar disclosed in PCT International Publication No. WO 2005/059617, or potassium chloride (with a refractive index of approximately 1.75) disclosed in PCT International Publication No. WO 2005/059618, or similar can be used. Furthermore, a thin film having liquid affinity properties and/or a dissolution-preventing function may be formed on a portion of (including at least the contact faces with the liquid) or the entirety of the terminus optical element. Quartz has high affinity to liquid and thus a dissolution preventive film is not necessary therefor. However, as for fluorite, it is preferable that at least a dissolution preventive film be formed thereon. In addition, it is also possible to use various fluids, e.g., a supercritical fluid, as the liquid LQ. As a liquid with refractive index higher than pure water (for example 1.5 or higher), for example isopropanol with a refractive index of approximately 1.50, glycerol (glycerin) with a refractive index of approximately 1.61, and other prescribed liquids having C—H bonds or O—H bonds, as well as hexane, heptane, decane, and other prescribed liquids (organic solvents), as well as decalin (decahydronaphthalene) with a refractive index of approximately 1.60, may be used. Further, as the liquid two or more arbitrary liquids among these liquids may be mixed together and used, or one or more of these liquids may be added to (mixed with) pure water and used. Further, as the liquid, pure water to which $H^+$, $Cs^+$, $K^+$, $Cl^-$, $SO_4^{2-}$, $PO_4^{2-}$, or other bases or acids are added (mixed) may be used, or pure water to which an Al oxide or other fine particles have been added (mixed) may be used. Also, as the liquid, it is preferable that a liquid be used which has a low optical absorption coefficient, a small temperature dependence, and which is stable with respect to photosensitive materials (or topcoat films, or anti-reflection films, or similar) applied to the surfaces of the projection optical system and/or substrate. In addition, a topcoat film or similar can be provided on the substrate to protect photosensitive materials or substrates from the liquid.

In addition, if, for example, $F_2$ laser light is used as the exposure light EL, then it will not transmit through water; in this case, a fluid that can transmit the $F_2$ laser light can be used as the liquid LQ, e.g., a fluorine based fluid such as perfluoropolyether (PFPE) or a fluorine based oil. In this case, the parts that contact the liquid LQ are lyophilically treated by forming a thin film with, for example, a substance that has a molecular structure that contains fluorine or the like and has low polarity.

Furthermore, the substrate P in each of the embodiments discussed above is not limited to a semiconductor wafer for fabricating semiconductor devices, but can also be adapted to, for example, a glass substrate for display devices, a ceramic wafer for thin film magnetic heads, or a mask or the original plate of a reticle (synthetic quartz or a silicon wafer), film member, and similar used by an exposure apparatus. Moreover, substrates are not limited to round shape, but may be rectangular or other shapes.

The exposure apparatus EX can also be adapted to a step-and-scan type scanning exposure apparatus (a scanning stepper) that scans and exposes the pattern of the mask M by synchronously moving the mask M and the substrate P, as well as to a step-and-repeat type projection exposure apparatus (a stepper) that performs full field exposure of the pattern of the mask M with the mask M and the substrate P in a stationary state, and sequentially steps the substrate P.

Furthermore, when performing an exposure with a step-and-repeat system, the projection optical system PL is used to transfer a reduced image of a first pattern onto the substrate P in a state wherein the first pattern and the substrate P are substantially stationary, after which the projection optical system PL may be used to perform full-field exposure of the substrate P, wherein a reduced image of a second pattern partially superposes the transferred first pattern (as in a stitching type full-field exposure apparatus) in a state wherein the second pattern and the substrate P are substantially stationary. In addition, the stitching type exposure apparatus can also be adapted to a step-and-stitch type exposure apparatus that transfers at least two patterns onto the substrate P so that they are partially superposed, and sequentially steps the substrate P.

In addition, the present invention can also be adapted to, for example, an exposure apparatus that combines the patterns of two masks on a substrate through a projection optical system and double exposes, substantially simultaneously, a single shot region on the substrate using a single scanning exposure, as disclosed in, for example, Published Japanese Translation No. 2004-519850 of the PCT International Publication (corresponding U.S. Pat. No. 6,611,316). In addition, the present invention can also be adapted to, for example, a proximity type exposure apparatus and a mirror projection aligner.

In addition, the present invention can also be adapted to a twin stage type exposure apparatus that is provided with a plurality of substrate stages, as disclosed in, for example, Japanese Patent Application Publication No. H10-163099A, Japanese Patent Application Publication No. H10-214783A, Published Japanese Translation No. 2000-505958 of the PCT International Publication, U.S. Pat. Nos. 6,341,007, 6,400, 441, 6,549,269, 6,590,634, 6,208,407, and 6,262,796.

Furthermore, the present invention can also be adapted to an exposure apparatus that is provided with a substrate stage that holds a substrate and a measurement stage whereon various photoelectric sensors and/or a fiducial member, wherein a fiducial mark is formed, are installed, as disclosed in, for example, Japanese Patent Application Publication No. H 11-135400A, and Japanese Patent Application Publication No. 2000-164504A (corresponding U.S. Pat. No. 6,897,963). In addition, the present invention can also be adapted to an exposure apparatus that comprises a plurality of substrate stages and measurement stages.

The type of exposure apparatus EX is not limited to a semiconductor device fabrication exposure apparatus that exposes the substrate P with the pattern of a semiconductor device, but can also be widely adapted to exposure apparatuses that are used for fabricating, for example, liquid crystal devices or displays, and to exposure apparatuses that are used for fabricating thin film magnetic heads, image capturing devices (CCDs), micromachines, MEMS, DNA chips, or reticles and masks.

Furthermore, in each of the embodiments discussed above, the positional information of the mask stage 1 and the substrate stage 2 is measured using an interferometer system that comprises the laser interferometers 1S, 2S, but the present invention is not limited thereto; for example, an encoder system may be used that detects a scale (diffraction grating) that is provided to each of the stages 1, 2. In this case, the system is preferably configured as a hybrid system that is provided with both an interferometer system and an encoder system, and it is preferable to use the measurement results of the interferometer system to calibrate the measurement results of the encoder system. In addition, the position of the stages may be controlled by switching between the interferometer system and the encoder system, or by using both.

In addition, in each of the embodiments discussed above, an ArF excimer laser may be used as the light source apparatus that generates ArF excimer laser light, which serves as the exposure light EL; however, as disclosed in, for example, PCT International Publication WO1999/46835 (corresponding U.S. Pat. No. 7,023,610), a harmonic generation apparatus may be used that outputs pulsed light with a wavelength of 193 nm and that comprises: an optical amplifier part, which has a solid state laser light source (such as a DFB semiconductor laser or a fiber laser), a fiber amplifier, and the like; and a wavelength converting part. Furthermore, in the abovementioned embodiments, both the illumination area and the projection area are rectangular, but they may be some other shape, e.g., arcuate.

Furthermore, in each of the embodiments discussed above, a light transmitting type mask is used wherein a prescribed shielding pattern (or a phase pattern or a dimming pattern) is formed on a light transmitting substrate; however, instead of such a mask, a variable forming mask (also called an electronic mask, an active mask, or an image generator), wherein a transmittance pattern, a reflected pattern, or a light emitting pattern is formed based on electronic data of the pattern to be exposed, may be used as disclosed in, for example, U.S. Pat. No. 6,778,257. The variable forming mask comprises a DMD (digital micromirror device), which is one kind of non-emissive type image display device (also called a Spatial Light Modulator (SLM)). The exposure apparatus using a DMD is disclosed for example in U.S. Pat. No. 6,778,257. In addition, the variable forming mask is not limited to a DMD, and a non-emissive type image display device, which is explained below, may be used instead. Here, the non-emissive type image display device is a device that spatially modulates the amplitude (the intensity), the phase, or the polarization state of the light that travels in a prescribed direction; furthermore, examples of a transmissive type spatial light modulator include a transmissive type liquid crystal display (LCD) as well as an electrochromic display (ECD). In addition, examples of a reflecting type spatial light modulator include a DMD, which was discussed above, as well as a reflecting mirror array, a reflecting type LCD, an electrophoretic display (EPD), electronic paper (or electronic ink), and a grating light valve.

In addition, instead of a variable forming mask that is provided with a non-emissive type image display device, a pattern forming apparatus that comprises a self luminous type image display device may be provided. In this case, an illumination system is not necessary. Here, examples of a self luminous type image display device include a CRT (cathode ray tube), an inorganic electroluminescence display, an organic electroluminescence display (OLED: organic light emitting diode), an LED display, an LD display, a field emission display (FED), and a plasma display (PDP: plasma display panel). In addition, a solid state light source device that has a plurality of light emitting points or that creates a plurality of light emitting points on a single substrate, a solid state light source chip array wherein a plurality of chips are arrayed, or the like may be used as the self luminous type image display device that constitutes the pattern forming apparatus, and the pattern may be formed by electrically controlling the solid state light source chip(s). Furthermore, it does not matter whether the solid state light source device is inorganic or organic.

Each of the embodiments discussed above explained an exemplary case of an exposure apparatus that is provided with the projection optical system PL, but the present invention can be adapted to an exposure apparatus and an exposing method that do not use the projection optical system PL. Thus, even if the projection optical system PL is not used, the exposure light is radiated onto the substrate through optical members, e.g., lenses, and an immersion space is formed in a prescribed space between the substrate and those optical members.

In addition, by forming interference fringes on the substrate P as disclosed in, for example, PCT International Publication WO2001/035168, the present invention can also be adapted to an exposure apparatus (a lithographic system) that exposes the substrate P with a line-and-space pattern.

Furthermore, the requirements of each of the embodiments discussed above can be appropriately combined. In addition, as far as is permitted, each disclosure of every Japanese patent document and U.S. patent documents related to the exposure apparatus recited in each of the embodiments discussed above, modified examples, and the like is hereby incorporated by reference in its entirety.

As described above, the exposure apparatus EX of the embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

As shown in FIG. 10, a micro-device, such as a semiconductor device, is manufactured by: a step 201 that designs the functions and performance of the micro-device; a step 202 that fabricates a mask (a reticle) based on this design step; a step 203 that fabricates a substrate, which is the base material of the device; a substrate processing step 204 that comprises a substrate process (exposure process) that includes, in accordance with the embodiments discussed above, exposing the substrate with the exposure light using the mask pattern and developing the exposed substrate; a device assembling step 205 (which includes fabrication processes such as dicing, bonding, and packaging processes); an inspecting step 206; and the like.

What is claimed is:

1. A liquid recovery system that is used in an immersion exposure apparatus, comprising:
   a first surface and a second surface on the side opposite the first surface, an object opposing the first surface being moved relative to the first surface below the first surface;
   a liquid recovery part, at least a part of which opposes the second surface with a first gap interposed therebetween, gas being prevented from being recovered from the liquid recovery part;
   a first opening which is connected with the first gap and through which liquid on the object flows into the first gap, the liquid in the gap being recovered via the liquid recovery part; and
   a second opening different from the first opening, through which gas flows from the first gap, the second opening being located higher than the liquid recovery part and the second opening being located such that the liquid is prevented from flowing to the second opening.

2. A liquid recovery system according to claim 1, wherein the liquid recovery part comprises a recovery region that is capable of recovering the liquid and that has a larger area than the second surface.

3. A liquid recovery system according to claim 1, wherein the liquid recovery part comprises a porous member; and
   at least a part of the liquid that contacts the porous member is recovered via the porous member.

4. A liquid recovery system according to claim 3, wherein the porous member prevents the gas from passing therethrough.

5. A liquid recovery system according to claim 1, wherein gas being prevented from being recovered from the liquid recovery part.

6. A liquid recovery system according to claim 1,
   wherein,
   the first gap is open to the atmosphere via the second opening.

7. A liquid recovery system according to claim 1, wherein a distance between the second opening and the object is larger than a distance between the first opening and the object.

8. A liquid recovery system according to claim 1, wherein the second opening does not face the object.

9. A liquid recovery system according to claim 1, wherein the first opening is provided between an edge of the first surface and the liquid recovery part.

10. A liquid recovery system according to claim 1, further comprising:
    a third opening;
    wherein,
    the liquid on the object that opposes the third opening can flow from the third opening into the first gap via the first opening.

11. A liquid recovery system according to claim 10, comprising:
    a first member that comprises the liquid recovery part; and
    a second member that is disposed in a vicinity of the first member;
    wherein,
    the third opening is formed between the first member and the second member.

12. A liquid recovery system according to claim 11, wherein
    the second member comprises a liquid contact surface; and
    the liquid on the object that opposes the liquid contact surface of the second member and the first surface can flow from the third opening into the first gap via the first opening.

13. A liquid recovery system according to claim 12, wherein
    a distance between the object and the first surface is smaller than a distance between the object and the liquid contact surface.

14. A liquid recovery system according to claim 11, comprising:
    a second gap that is provided between the first member and the second member; and
    a fourth opening that is different from the third opening;
    wherein,
    the second gap is connected to the third opening and is open to the atmosphere via the fourth opening.

15. A liquid recovery system according to claim 1, wherein
    the liquid recovery part comprises a first region, which faces the object, and a second region, which faces the second surface, and
    the second region of the liquid recovery part is capable of recovering the liquid that flows into the first gap via the first opening.

16. A liquid recovery system according to claim 15, wherein
    the liquid recovery part is provided at at least a part of a space surrounding a liquid contact surface between which and the object the liquid can be retained.

17. A liquid recovery system according to claim 16, wherein
    the second region of the liquid recovery part is provided outside the first region with respect to the liquid contact surface.

18. A liquid recovery system according to claim 16, wherein
    a distance between the object and the liquid contact surface is smaller than a distance between the object and the first region.

19. A liquid recovery system according to claim 16, wherein
    a distance between the object and the liquid contact surface is larger than a distance between the object and at least a part of the first surface.

20. A liquid recovery system according to claim 16, wherein
    the first surface is substantially parallel to the liquid contact surface.

21. A liquid recovery system according to claim 16, wherein
    the second surface comprises an edge that is disposed at the first opening and that is closer to the object than the liquid contact surface.

22. A liquid recovery system according to claim 1, wherein
    the first opening is provided annularly; and
    the first gap is provided annularly along the first opening.

23. A liquid recovery system according to claim 22, wherein
    the liquid recovery part is provided annularly along the first gap.

24. A liquid recovery system according to claim 1, wherein the first gap forms a capillary passage into which the liquid on the object can flow.

25. A liquid recovery system according to claim 1, wherein the second surface comprises an inclined part that is inclined with respect to the first surface.

26. A liquid recovery system according to claim 1, wherein the second surface comprises an inclined part, which is inclined with respect to the first surface, and a flat part, which is substantially parallel to the first surface.

27. A liquid recovery system according to claim 1, wherein the second surface is lyophilic with respect to the liquid.

28. A liquid recovery system according to claim 1, wherein the first surface is liquid repellent with respect to the liquid.

29. An immersion exposure apparatus that exposes a substrate, comprising:
an optical member that comprises an emergent surface from which exposure light is emitted; and
an immersion member which includes:
the first surface, an object opposing the first surface being moved relative to the first surface below the first surface,
a second surface on the side opposite the first surface;
a liquid recovery part, at least a part of which opposes the second surface with a first gap interposed therebetween;
a first opening which is connected with the first gap and through which liquid on the object flows into the first gap, the liquid in the gap being recovered via the liquid recovery part; and
a second opening different from the first opening, through which gas flows from the first gap, the second opening being located higher than the liquid recovery part and the second opening being located such that the liquid is prevented from flowing to the second opening.

30. An immersion exposure apparatus according to claim 29, wherein
the liquid recovery part comprises a recovery region that is capable of recovering the liquid and that has a larger area than the second surface.

31. An immersion exposure apparatus according to claim 29, wherein
the object is moved to a position that opposes the emergent surface of the optical member.

32. An immersion exposure apparatus according to claim 29, wherein
the object comprises the substrate; and
the substrate is irradiated with the exposure light through the liquid on the substrate.

33. An immersion exposure apparatus according to claim 29, wherein
the liquid recovery part comprises a porous member; and
at least a part of the liquid that contacts the porous member is recovered via the porous member.

34. An immersion exposure apparatus according to claim 33, wherein
the porous member prevents a gas from passing therethrough.

35. An immersion exposure apparatus according to claim 29, wherein
gas being prevented from being recovered from the liquid recovery part.

36. An immersion exposure apparatus according to claim 29,
wherein,
the first gap is open to the atmosphere via the second opening.

37. An immersion exposure apparatus according to claim 29, wherein
a distance between the second opening and the object is larger than a distance between the first opening and the object.

38. An immersion exposure apparatus according to claim 29, wherein
the second opening does not face the object.

39. An immersion exposure apparatus according to claim 29, wherein
the first opening is provided between an edge of the first surface and the liquid recovery part.

40. An immersion exposure apparatus according to claim 29, further comprising:
a third opening;
wherein,
the liquid on the object that opposes the third opening can flow from the third opening into the first gap via the first opening.

41. An immersion exposure apparatus according to claim 40, comprising:
a first member that comprises the liquid recovery part; and
a second member that is disposed in a vicinity of the optical member so that the second member surrounds an optical path of the exposure light;
wherein,
the third opening is formed between the first member and the second member.

42. An immersion exposure apparatus according to claim 41, wherein
the second member comprises a liquid contact surface; and
the liquid on the object that opposes the liquid contact surface of the second member and the first surface of the plate can flow from the third opening into the first gap via the first opening.

43. An immersion exposure apparatus according to claim 42, wherein
a distance between the object and the first surface is smaller than a distance between the object and the liquid contact surface.

44. An immersion exposure apparatus according to claim 42, wherein
the liquid contact surface of the second member is parallel to a front surface of the object.

45. An immersion exposure apparatus according to claim 42, wherein
the second member has an opening through which the exposure light passes.

46. An immersion exposure apparatus according to claim 41, comprising:
a second gap that is provided between the first member and the second member; and
a fourth opening that is different from the third opening;
wherein,
the second gap is connected to the third opening and is open to the atmosphere via the fourth opening.

47. An immersion exposure apparatus according to claim 29, wherein
the liquid recovery part comprises a first region, which faces the object, and a second region, which faces the second surface, and
the second region of the liquid recovery part is capable of recovering the liquid that flows into the first gap via the first opening.

48. An immersion exposure apparatus according to claim 47, further comprising:
an opening through which the exposure light passes; and
a liquid contact surface that is provided surrounding the opening, and between which and the object the liquid can be retained,
wherein
the liquid recovery part is provided at at least a part of a space surrounding the liquid contact surface.

49. An immersion exposure apparatus according to claim 48, wherein
the second region of the liquid recovery part is provided outside the first region with respect to the liquid contact surface.

50. An immersion exposure apparatus according to claim 48, wherein
a distance between the object and the liquid contact surface is smaller than a distance between the object and the first region.

51. An immersion exposure apparatus according to claim 48, wherein
a distance between the object and at least a part of the first surface is smaller than a distance between the object and the liquid contact surface.

52. An immersion exposure apparatus according to claim 48, wherein
the first surface is substantially parallel to the liquid contact surface.

53. An immersion exposure apparatus according to claim 48, wherein
the second surface comprises an edge that is disposed at the first opening and that is closer to the object than the liquid contact surface.

54. An immersion exposure apparatus according to claim 29, wherein
the first surface is movable relative to the liquid recovery part.

55. An immersion exposure apparatus according to claim 29, wherein
the first opening is provided annularly so that the first opening surrounds the optical path of the exposure light; and
the first gap is provided annularly along the first opening.

56. An immersion exposure apparatus according to claim 55, wherein
the liquid recovery part is provided annularly along the first gap.

57. An immersion exposure apparatus according to claim 29, wherein
the first gap forms a capillary passage into which the liquid on the object can flow.

58. An immersion exposure apparatus according to claim 29, wherein
the first surface is disposed so that the first surface surrounds the optical path of the exposure light; and
at least a part of the first surface comprises an inclined part that gradually becomes more spaced apart from the front surface of the object, which opposes the first surface, in a direction that leads away from the optical path of the exposure light.

59. An immersion exposure apparatus according to claim 29, wherein
the second surface comprises an inclined part that is inclined with respect to the first surface.

60. An immersion exposure apparatus according to claim 29, wherein
the second surface comprises an inclined part, which is inclined with respect to the first surface, and a flat part, which is parallel to the first surface.

61. An immersion exposure apparatus according to claim 59, wherein
the inclined part gradually becomes more spaced apart from the front surface of the object, which opposes the first surface, in a direction that leads away from the optical path of the exposure light.

62. An immersion exposure apparatus according to claim 29, wherein
the second surface is lyophilic with respect to the liquid.

63. An immersion exposure apparatus according to claim 29, wherein
the first surface is liquid repellent with respect to the liquid.

64. A device fabricating method, comprising:
exposing a substrate using an immersion exposure apparatus according to claim 29; and
developing the exposed substrate.

65. An immersion exposing method that exposes a substrate, the method comprising:
exposing the substrate with exposure light through a liquid on the substrate; and
recovering the liquid on the substrate using a liquid recovery system during the exposure of the substrate;
wherein,
the liquid recovery system comprises;
a first surface and a second surface on the side opposite the first surface, an object opposing the first surface being moved relative to the first surface below the first surface; and
a liquid recovery part that is disposed so that at least a part of the liquid recovery part opposes the second surface with a first gap interposed therebetween;
a first opening which is connected with the first gap and through which liquid on the object flows into the first gap, the liquid in the gap being recovered via the liquid recovery part; and
a second opening different from the first opening, through which gas flows from the first gap, the second opening being located higher than the liquid recovery part and the second opening being located such that the liquid is prevented from flowing to the second opening.

66. An immersion exposing method according to claim 65, wherein
the liquid recovery part comprises a porous member.

67. A device fabricating method comprising:
exposing a substrate using an exposing method according to claim 65; and
developing the exposed substrate.

* * * * *